United States Patent [19]

Tsuchiya et al.

[11] Patent Number: 4,908,795
[45] Date of Patent: Mar. 13, 1990

[54] SEMICONDUCTOR INTEGRATED CIRCUIT DEVICE WITH BUILT-IN MEMORIES

[75] Inventors: Fumio Tsuchiya; Kiyoshi Matsubara, both of Kodaira, Japan

[73] Assignee: Hitachi, Ltd., Tokyo, Japan

[21] Appl. No.: 255,252

[22] Filed: Oct. 11, 1988

Related U.S. Application Data

[62] Division of Ser. No. 802,198, Nov. 25, 1985.

[30] Foreign Application Priority Data

Nov. 26, 1984 [JP] Japan .................. 59-248106
Nov. 26, 1984 [JP] Japan .................. 59-248108

[51] Int. Cl.$^4$ .................. G11C 7/00; G11C 11/40
[52] U.S. Cl. .................. 365/189.01; 365/104; 365/230.05; 365/189.03
[58] Field of Search .............. 365/230, 189, 185, 182, 365/189.01, 189.02, 230.05, 203, 104

[56] References Cited

U.S. PATENT DOCUMENTS

| | | | |
|---|---|---|---|
| 4,282,446 | 8/1981 | McElroy | 307/238.5 |
| 4,289,982 | 9/1981 | Smith | 307/463 |
| 4,494,187 | 1/1985 | Simpson | 364/200 |
| 4,763,303 | 8/1988 | Flannagan | 365/189.01 |
| 4,787,764 | 11/1988 | Tsuchiya et al. | 365/185 X |
| 4,835,684 | 5/1989 | Kanai | 365/189.03 X |

FOREIGN PATENT DOCUMENTS 80-02881 12/1980 PCT Int'l Appl. .

OTHER PUBLICATIONS

IEEE Journal of Solid State Circuits, vol. SC-18, No. 5, Oct. 83, High Speed Ultra Low Power 64K CMOS EPROM with On Chip Test Functions by Knecht et al.

Primary Examiner—Stuart N. Hecker
Assistant Examiner—Alyssa H. Bowler
Attorney, Agent, or Firm—Antonelli, Terry & Wands

[57] ABSTRACT

A data processing LSI constructing a microcomputer has an EPROM for changing a program. The EPROM can be accessed directly through the external terminals of the data processing LSI. The EPROM is statically operated when it is written with data by direct access. However, the statically operated EPROM consumes relatively high power. This power consumption by the EPROM is reduced by dynamically operating its read circuit, address decoder and so on. For example, the read circuit is constructed of a sense amplifier and a latch circuit, and the sense amplifier has its operation interrupted after the latch circuit has latched the read data. The address decoder is composed of a load MOSFET and address MOSFETs. The load MOSFET is caused to act as a precharge element in the dynamic operation and as an operation current feeding element in the static operation.

36 Claims, 9 Drawing Sheets

SEMICONDUCTOR INTEGRATED CIRCUIT DEVICE WITH BUILT-IN MEMORIES

This is a divisional of application Ser. No. 802,198, filed Nov. 25, 1985, now U.S. Pat. No. 4,783,764.

BACKGROUND OF THE INVENTION

The present invention relates to a semiconductor integrated circuit technique and, more particularly, to a technique which is effective when applied to a semiconductor integrated circuit device having a rewritable read only semiconductor memory, e.g., to a single chip micro computer having a built-in EPROM (i.e., Electrically Programmable Read Only Memory).

A data processing LSI (i.e., Large Scale Integrated circuit) such as a single chip microcomputer (hereafter referred to as a "single-chip micon") is typically equipped integrally with a ROM (i.e., Read Only Memory) for storing the operation programs or the like of a system. The built-in ROM of the single-chip micon is generally constructed of a mask ROM which cannot be rewritten. A rewritable memory called an "EPROM" is mounted on the LSI package.

Here, a single-chip micon having a mask ROM on the chip is disclosed relatively in detail on pp. 45 to 82, Semiconductor Data Book entitled "8/16 Bit Micro Computer" issued by Hitachi, Ltd., in September, 1982, and a single-chip micron having the EPROM on the package is also disclosed on pp. 350 to 389 of the same Data Book.

The aforementioned ROM-mounted, including that of the on-chip type, single-chip micon is constructed such that a sense amplifier or a read circuit is operating continuously during the reading cycle of the ROM. However, the sense amplifier of the ROM mounted on the single-chip micon need not operate continuously during the reading cycle. The sense amplifier need not operate if its output is latched after the output of the read data has been established. Therefore, it has been clarified by us that the single-chip micon of the prior art wastes power in the sense amplifier.

In a semiconductor memory such as a static RAM proposed in the prior art, on the other hand, the operation of the sense amplifier is interrupted so as to reduce power consumption after the output of the read data has been established. Despite this fact, however, a single device memory such as a static RAM rather than an on-chip type is operated by a control signal such as a chip enable signal fed from the micon but does not receive an external timing pulse (a clock pulse). Here, in order to reduce power consumption, it is advisable to operate the sense amplifier dynamically. In order that the sense amplifier may operate dynamically without any external feed of a special timing pulse, however, it is necessary to provide a built-in timing generation circuit such as an address change detection circuit for generating a timing signal by detecting the changes in an address signal fed from the outside. When this is done, however, the timing generation circuit must be large and complex to handle the large number of address bits.

Next, in the single-chip micon of the aforementioned EPROM mounted type (including the on-chip type), generally speaking the number of circuit elements composing a decoder for the EPROM is larger than that of the dynamic type, if the decoder to be constructed is of the static type as in the prior art. This raises another disadvantage, in that the decoder occupies a larger area and wastes power.

Here, the single-chip micon of the EPROM mounted type has therein clocks indicating the timing in the mode (hereafter referred to as a "micon mode") where it operates an ordinary microcomputer. This makes it easy to operate the EPROM decoder dynamically. Since, however, there is no suitable timing signal in the operation mode (hereafter referred to as an "EPROM mode") for writing the EPROM, still another disadvantage arises in that it is necessary, for example, either to provide such a circuit inside the chip as will generate a timing signal for operating the decoder dynamically by detecting the changes in the address signal or to generate and feed such a signal in an external EPROM writer.

SUMMARY OF THE INVENTION

An object of the present invention is to reduce the power consumption of a ROM-mounted LSI without providing a complicated circuit such as an address change detection circuit.

Another object of the present invention is to provide a technique for a ROM-mounted LSI to accurately detect the timing of interrupting a sense amplifier.

Still another object of the present invention is to reduce the power consumption of an LSI having an erasable programmable ROM mounted thereon and to improve the operating speed of a ROM.

A further object of the present invention is to reduce both the area occupied by a decoder for the ROM mounted on a chip and the chip size of the whole LSI.

The aforementioned and other objects and novel features of the present invention will become apparent from the following description made with reference to the accompanying drawings.

Representatives of the invention to be disclosed herein will be summarized in the following.

According to one representative, more specifically, it is noted that a data processing LSI such as a single-chip micon having a ROM mounted thereon has therein a clock indicating timing. By making use of this clock, a sense amplifier is not started, when the ROM is to be read, immediately after the reading cycle has been entered, but is started at the timing when a word line in the ROM is selected and the level of a data line is determined. After the data bas been read out, moreover, the sense amplifier has its operation interrupted when the output of the sense amplifier is latched. Thus, the sense amplifier can have its operating period shortened and its power consumption reduced without requiring a complicated timing generation circuit such as an address change detection circuit.

Beside, the aforementioned object of making it possible to accurately detect the timing of interrupting a sense amplifier to minimize the operation period of the sense amplifier, as required, by providing a dummy memory array in addition to the memory array of a built-in ROM and a sense amplifier; by setting such data in advance in a dummy memory array which will never fail to have its data line level changed when data is read out, and by reading out and detecting the data of that dummy memory array.

Noting that a data processing LSI such as a single-chip micon having an EPROM mounted thereon always has therein a clock indicating timing, according to another representative: the decoder for the EPROM is constructed into the dynamic type so as to occupyless area; the power consumption is reduced by dynamically operating the decoder in the micon mode with the internal clock while making faster operation possible; and the EPROM can be written to without feeding a suitable external timing signal and without providing an internal circuit such as an address change detection circuit, i.e., without enlarging the chip size, and without changing the EPROM writer, by statically operating the decoder in the EPROM mode.

DESCRIPTION OF THE PREFERRED EMBODIMENTS

[Embodiment 1]

Figure 3:
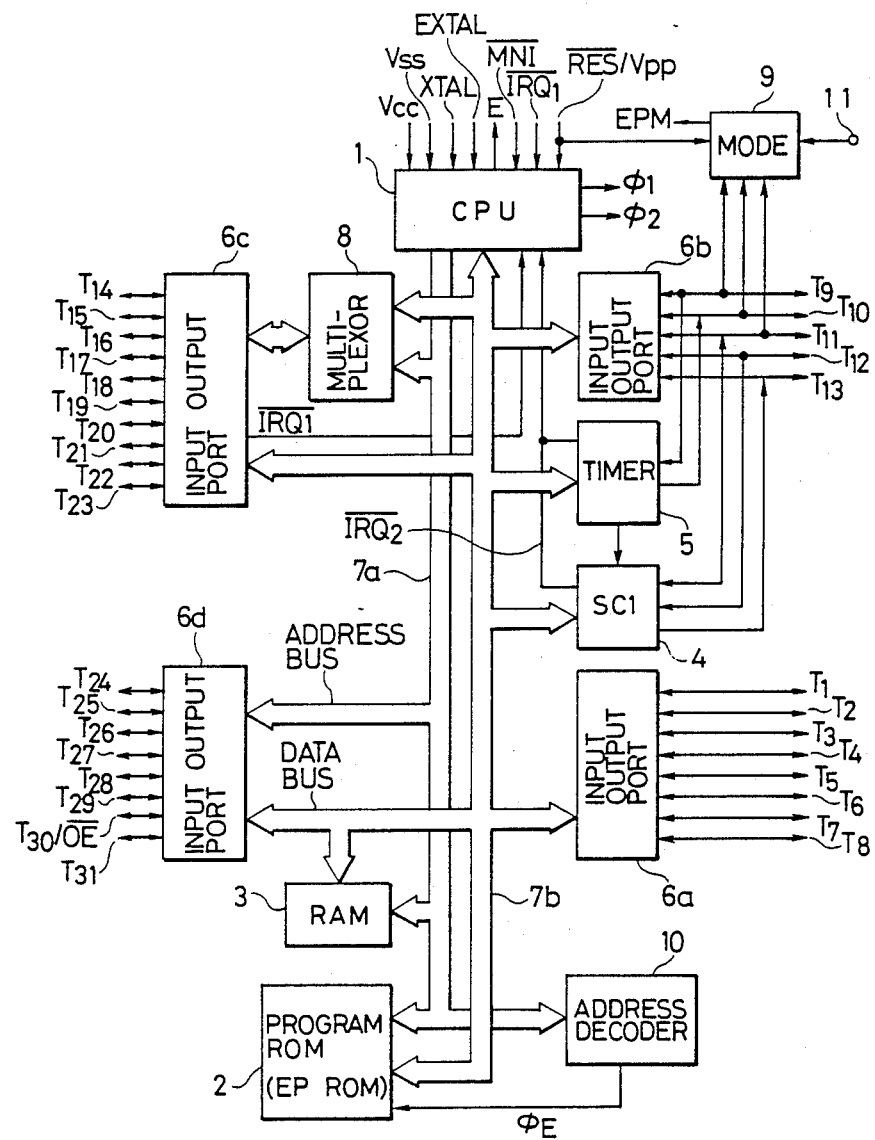
FIG. 3 is a block diagram showing a single-chip micon with a built-in EPROM according to one embodiment of the present invention.

FIG. 3 shows one example of the structure of a single-chip micon to which the present invention is applied, and the individual circuit portions as shown are formed on one semiconductor substrate made of silicon or the like.

The single-chip micon of the present embodiment is constructed, although not especially limited to this configuration, of: a microprocessor (hereafter referred to as a "CPU") 1 for controlling internal execution units in accordance with a program; a program ROM 2 with an operation program stored therein for that CPU 1; a RAM (i.e., Random Access Memory) 3 mainly for providing the operation region of the CPU 1; a serial communication interface circuit 4; a timer circuit 5; and four input/output ports 6a to 6d. The circuits cited above are mutually connected through an internal address bus 7a and an internal data bus 7b.

The CPU 1 is not shown in detail because its specific construction has no direct relation to the present invention. The CPU 1 is constructed of: a control unit composed of a program counter for latching an instruction or data address to be read out at a subsequent step, an instruction register in which instructions making up the program are sequentially fetched, and a micro ROM or a random logic circuit with a micro program stored therein, said control unit being made operative to generate a control signal according to the instruction fetched in the instruction register; and an execution unit composed of a variety of registers such as an accumulator and an ALU (i.e., Arithmetic Logic Unit).

Figure 5:
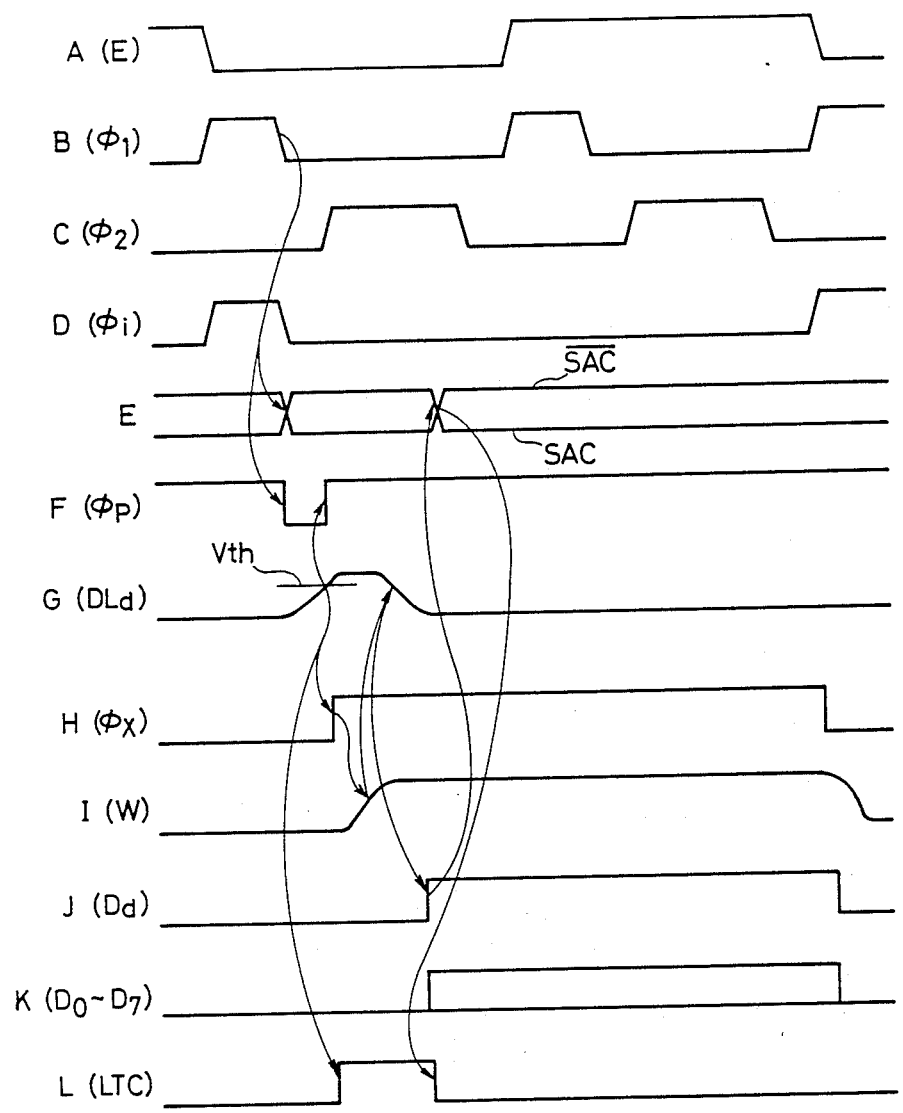
FIG. 5 is a timing chart showing the operation of that EPROM circuit.

The CPU 1 is equipped therein, although this is not shown, with a clock pulse generator which is made operative to divide the frequency of an original oscillatory signal of 4 MHz fed from the outside to generate both internal clock signals $\phi_1$ and $\phi_2$, as shown at B and C in FIG. 5, which are out of phase by one half period so that the periods of low level may not overlap, and an external synchronism signal E (as shown at A in FIG. 5) which has a frequency one half as high as that of those internal clock signals $\phi_1$ and $\phi_2$ and which is substantially in phase with the clock $\phi_1$. Those internal clock signals $\phi_1$ and $\phi_2$ are fed to control the individual circuit blocks in the chip such as a control circuit (which will be described hereinafter) in the program ROM 2 in synchronism with the CPU 1.

The external synchronism signal E is outputted to an outside of the single-chip micon and is fed as a system clock pulse to the peripheral devices.

Of the input/output ports 6a to 6d, the port 6d is connected to the address bus 7a and the data bus 7b, and the port 6c can be connected through a multiplexer to the address bus 7a and the data bus 7b. There is further provided a mode exchange circuit 9 for determining the operation mode after the micon has been reset when a suitable external terminal 11 is set at a predetermined state. The input/output port 6d has its operation controlled by that mode exchange circuit 9 so as to have a data input and output function or an address output function, and the port 6c likewise has its operation controlled so as to serve as a data input and output function or as a function to multiplex the data bus and the address bus.

As a result, the single-chip micon of the present embodiment has its address space made expandable.

In this embodiment, moreover, the program ROM 2 is constructed, although not especially limited to this configuration, of a programmable EPROM which has a storage capacity such as 4 k×8 bits.

The single-chip micon is also equipped therein with an address decoder 10 for selectively operating the program ROM 2. When the address data output from the CPU 1 onto the address bus 7a falls within the address range given to the program ROM (EPROM) 2, it is decoded by the address decoder 10 so that an enable signal $\phi_E$ is output from the address decoder 10. The program ROM 2 is brought into its operative state by that enable signal $\phi_E$.

The mode exchange circuit 9 discriminates whether the input state or level of the mode setting external terminal 11 especially provided indicates the mode (hereafter referred to as the "micon mode"), in which it operates as an ordinary microcomputer, or the mode (hereafter referred to as the "EPROM mode") in which the data is written in the program ROM 2, and determines the internal operation mode of the micon in accordance with the discrimination. The mode exchange circuit 9 determines the operation states of the input/output ports 6a to 6d inside of the micon in dependence upon control signals fed to external terminals $T_9$ to $T_{11}$, if the signal level of the external terminal 11 indicates the micon mode.

If the external terminal 11 is set at a signal level indicating the EPROM mode so that the internal state is set to the EPROM mode by the mode exchange circuit 9, the circuit components (e.g., the CPU 1 or the RAM 3)

other than program ROM 2 and the input/output ports necessary for the data input are disconnected from the internal address bus 7a and the data bus 7b. As a result, only the EPROM is visible from the outside of the chip. In this EPROM mode, the internal clock signals $\phi_1$ and $\phi_2$ are not generated. Therefore, since neither of the clock signals $\phi_1$ and $\phi_2$ is fed, the erasable programmable ROM 2 (EPROM) is statically operated.

In the EPROM mode, the individual terminals of the single-chip micon are used in the following manner, for example.

More specifically: the input/output port 6c has its external terminals $T_{14}$ to $T_{21}$ used as data input and output terminals for the EPROM 2; the input/output port 6a has its external terminals $T_1$ to $T_8$ used as address terminals to which X-address signals $A_0$ to $A_7$ of the EPROM 2 are to be applied; and the input/output port 6d has its external terminals $T_{24}$ to $T_{27}$ used as address terminals, to which Y-address signals $A_8$ to $A_{11}$ are to be applied, and its external terminals $T_{28}$ and $T_{29}$ used as address input terminals to which address signals for indicating the EPROM 2 are to be applied. The input/output port 6d has its external terminal $T_{30}$ used as an output enable terminal to which an output enable signal $\overline{OE}$ for the EPROM 2 is to be applied. The CPU 1 has its resetting external terminal $\overline{RES}$ used as a write voltage terminal to which a writing high voltage Vpp for the EPROM 2 is to be applied.

The data is written in the EPROM 2 in the following manner, for example.

Specifically, the X- and Y-address signals for the EPROM 2 are applied to the external terminals $T_1$ to $T_8$ and $T_{24}$ to $T_{27}$, and the address signals for selectively operating the EPROM 2 are applied to the external terminals $T_{28}$ and $T_{29}$. The data signal for the EPROM 2 is applied to the external terminals $T_{14}$ to $T_{21}$, and the writing high voltage Vpp is applied to the external terminal $\overline{RES}$. If, in this state, the external terminal 11 of the mode exchange circuit 9 in FIG. 3 is set at the level indicating the EPROM mode, a control signal EPM is accordingly output from the mode exchange circuit 9. In response to the output of the control signal EPM, the address signals of the external terminals $T_1$ to $T_8$, $T_{24}$ to $T_{27}$, $T_{28}$ and $T_{29}$ are applied to the EPROM 2 and the address decoder 10, and the data signals of the external terminals $T_{14}$ to $T_{21}$ are applied to the EPROM 2. By the output of the control signal EPM while the writing voltage Vpp is being applied, a write circuit in the EPROM 2, which will be described later, is brought into its operative state so that the data is written in the EPROM 2.

A verifying operation after the end of the writing operation is enabled by the output enable signal $\overline{OE}$ which is applied to the external terminal $T_{30}$, for example, although the invention is not especially limited to this configuration. In order to make the verifying operation possible, for example, the mode exchange circuit 9 is constructed to refer to the level of the external terminal $T_{30}$ when the external terminal 11 is set at the direct access level of the EPROM 2. If the external terminal $T_{30}$ is set at an output enable level such as a low level, the external terminals $T_{14}$ to $T_{21}$ of the input/output ports 6c are caused to act as output terminals by the control of the input/output port 6c by the mode exchange circuit 9 at that time. Then, read circuit of the EPROM 2 (not-shown) is brought into its operative state so that the write data of the EPROM 2 is fed through the data bus line 7b and the input/output port 6c to the external terminals $T_{14}$ to $T_{21}$.

Figure 4:
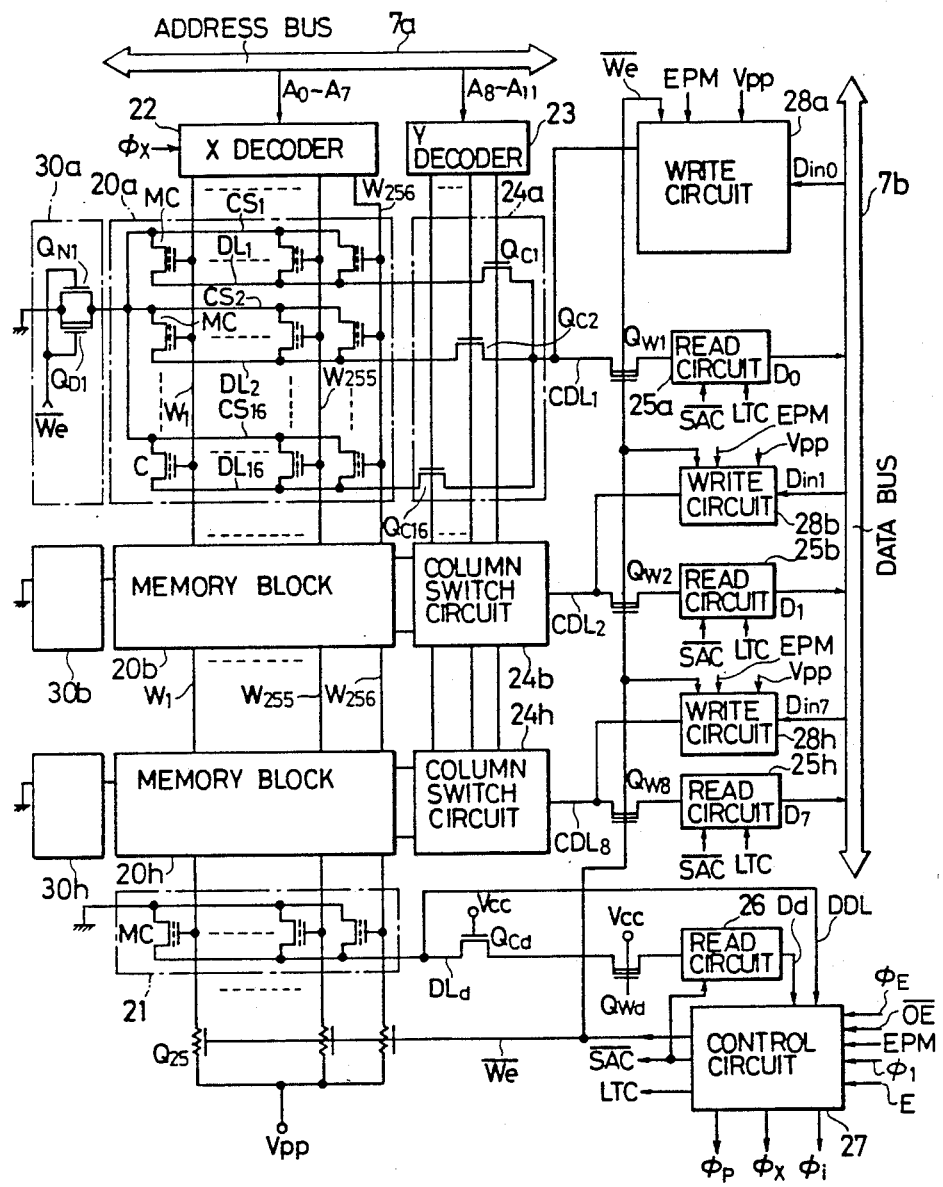
FIG. 4 is a circuit diagram showing one embodiment of an on-chip EPROM circuit.

FIG. 4 shows one embodiment of the program ROM 2 constructed of the EPROM, and FIG. 5 shows the timing chart of the same.

The program ROM in FIG. 4 is constructed of: an X-decoder 22 and a Y-decoder 23 having their input terminals coupled to the address bus line 7a; memory blocks 20a to 20h; variable impedance circuits 30a to 30h and column switch circuits 24a to 24h respectively corresponding to the respective memory blocks; read circuits 25a to 25h having their output terminals coupled to the data bus line 7b; write circuits 28a to 28h having their input terminals coupled to the data bus line 7b; a dummy memory array 21; a read circuit 26 corresponding to the dummy memory array 21; and a control circuit 27.

This control circuit 27 responds to the control signal $\phi_E$ output from the address decoder 10 in FIG. 3, the output enable signal $\overline{OE}$ fed in the EPROM mode through the external terminal $T_{30}$ and the address bus 7a in FIG. 3, a control signal EMP fed from the mode exchange circuit 9, and the clock signals $\phi_1$ and E to generate control signals $\phi_x$, $\phi_p$, $\overline{we}$, $\overline{SAC}$, LTC and so on for controlling the operations of the X-decoder 22, the variable impedance circuits 30a to 30h, the read circuits 25a to 25h, the write circuits 28a to 28h and so on.

The control signal $\phi_E$ output from the address decoder 10 in FIG. 3 can be deemed as a kind of chip enable signal for the EPROM 2.

If the control signal EMP output from the mode exchange circuit 9 in FIG. 3 indicates the micon mode level and if the enable signal $\phi_E$ indicates the EPROM 2, the control signals $\phi_p$ and $\phi_x$ are changed accordingly so as to dynamically operate the X-decoder 22. In synchronism with the clock signal $\phi_1$, more specifically, the control signal $\phi_p$ is so changed as to bring the X-decoder 22 into its precharged state, and the control signal $\phi_x$ is so changed as to determine the output level of the X-decoder 22 after the control signal $\phi_p$.

If the control signal EMP indicates the direct EPROM accessing mode level, the control signals $\phi_p$ and $\phi_x$ are accordingly set at such levels as to bring the X-decoder 22 into the static operating condition.

If the control signal EPM indicates the micon mode, the control signal $\overline{we}$ is accordingly held at such a high level as to bring the variable impedance circuits 30a to 30h into their low impedance states and the write circuits 28a to 28h into their inoperative states. If the control signal EPM indicates the EPROM mode, the control signal $\overline{we}$ is set at the low level in response to the output enable signal $\overline{OE}$.

If the control signal EMP indicates the micon mode and if the control signal $\phi_E$ indicates the selection of the EPROM 2, the control signal $\overline{SAC}$ is set at such a level as to bring the sense amplifiers of the read circuits 25a to 25h into their operative states at a predetermined timing.

The control signal LTC is so changed after the control signal $\overline{SAC}$ as to operate the latch circuits of the read circuits 25a to 25h.

The program ROM 2 of the present embodiment has the memory array which is divided into the eight memory blocks 20a to 20h, although the invention is not especially limited to this configuration. Each of the memory blocks is constructed of a nonvolatile memory cell MC which is composed of 256×16 pieces of FAMOS (i.e., Floating gate Avalanche injection MOS transistor) arranged in the form of a matrix.

To the memory blocks 20a to 20h, moreover, there are provided the dummy memory array 21 which is composed of one data line and 256 dummy memory cells each connected to the same.

Word lines $W_1$ to $W_{256}$ in the memory blocks 20a to 20h and the dummy memory array 21 are formed respectively continuously, and one of them is set at the selected level by the X-decoder 22 for receiving and decoding the address signals $A_0$ to $A_7$ appearing on the address bus 7a. The FAMOS constructing each memory cell MC has its threshold voltage set at a level slightly higher than the selection level (about 5 V) of the word lines $W_1$ to $W_{256}$ if it is written in advance, namely, if changes are injected in advance into the floating gate electrode thereof. On the other hand, the threshold voltage of the FAMOS in the so-called "erased state", in which no writing operation is conducted, is set at a level lower than the selected level of the word lines.

As a result, the FAMOS (i.e. the memory cell MC) on each row, which has its control gate electrode connected with the word line set at the selected level by the X-decoder 22, is rendered non-conductive or conductive in accordance with its preset write or erased state.

The X-decoder 22 has its operation controlled by the control signals $\phi_x$ and $\phi_p$ fed from the control circuit 27. If the external terminal 11 of the mode exchange circuit 9 in FIG. 3 is set at the level indicating the direct EPROM access mode, the control signals $\phi_x$ and $\phi_p$ are caused to take the level for statically operating the X-decoder 22. In this case, therefore, the X-decoder 22 sets such one of the word lines $W_1$ to $W_{256}$ at the selection level as corresponds to the address signals $A_0$ to $A_7$. If the control signal $\overline{we}$ is set at the low level on the basis of the control signal EPM and $\overline{OE}$, the selected word line is caused to take a level substantially equal to the write voltage Vpp.

If the external terminal 11 of FIG. 3 is set at the level for indicating the micon mode, the control signals $\phi_x$ and $\phi_p$ are changed in synchronism with the clock signal $\phi_1$, as has been described hereinbefore, when the enable signal $\phi_E$ is output.

In the memory block 20a, sixteen data lines $DL_1$ to $DL_{16}$, with which are connected the drain terminals of FAMOSes forming each column, are in turn connected with a common data line $CDL_1$ through column switches $Qc_1$ to $Qc_{16}$, each of which is made of a MOSFET (i.e., Insulated Gate type Field Effect transistor) and is adapted to be turned on by the X-decoder 23. The data lines in the remaining memory blocks 20b to 20h are also connected with common data lines $CDL_2$ to $CDL_8$ through the column switch circuits 24b to 24h. The Y-decoder 23 introduces and decodes the address signals $A_8$ to $A_{11}$ from the address bus 7a thereby to generate the data line selection signals. One of the column switches $Qc_1$ to $Qc_{16}$ is turned on when their gate electrodes receive the data line selection signals.

The common data lines $CDL_1$ to $CDL_8$ provided for the respective memory blocks 20a to 20h are connected with the read circuits 25a to 25h, respectively, through control transistors $Qw_1$ to $Qw_8$ which are made of depletion type MOSFETs.

According to the present embodiment, a dummy memory array 21 is provided, although the invention is not especially limited to that configuration. The dummy memory array 21 has its dummy data line DLd connected with the dummy read circuit 26 through a dummy column switch Qcd and a dummy controlling MOSFET Qwd which are normally conductive. When in the data reading operation, the read controlling MOSFETs $Qw_1$ to $Qw_8$ connected with the common data lines $CDL_1$ to $CDL_8$ are rendered conductive by the write control signal $\overline{WE}$ generated on the basis the mode designation signal EPM output from the mode exchange circuit 9 and the control signal $\overline{OE}$ input from the outside. The levels of the data lines are respectively amplified by the read circuits 25a to 25h provided to correspond to the common data lines $CDL_1$ to $CDL_8$, respectively, so that read signals $D_0$ to $D_7$ are output onto the data bus 7b.

At this time, as will be described in more detail hereinafter, the read end timing or the read enable timing is detected by detecting the level of the dummy data line DLd by means of the dummy read circuit 26. The control signals $\overline{SAC}$, LTC and so on output from the control circuit 27 are changed in response to the output of the dummy read circuit 26 so that the operations of the read circuits 25a to 25h and 26 are controlled (as shown in FIG. 5).

The source terminals of the FAMOSes forming the respective memory cells in the respective memory blocks 20a to 20h are connected for the respective columns with common source lines $Cs_1$ to $Cs_{16}$. These common source lines $Cs_1$ to $Cs_{16}$ are connected with the ground point of the circuit through the variable impedance circuits 30a to 30h which are composed of pairs of enhancement type MOSFETs to $Q_{N1}$ to $Q_{N8}$ and depletion type MOSFETs $Q_{D1}$ to $Q_{D8}$ connected in parallel for the respective columns. These respectively paired MOSFETs $Q_{N1}$ to $Q_{N8}$ and $Q_{D1}$ to $Q_{D8}$ are controlled by the write control signal $\overline{we}$.

When in the data reading operation, both the paired MOSFETs $Q_{N1}$ and $Q_{D1}$ have their gate terminals fed with the write control signal $\overline{we}$ at the high level so that they are turned on, to ground the common source lines $Cs_1$ to $Cs_8$. When in the data writing operation, on the other hand, the depletion one $Q_{D1}$ of the MOSFETs $Q_{N1}$ and $Q_{D1}$ is turned on irrespective of the low level of the write control signal $\overline{we}$. Through a suitable level resistance established by that MOSFET $Q_{D1}$, the common source lines $Cs_1$ to $Cs_8$ are grounded.

As a result, the common source lines have their potentials raised by the current flowing therefrom to the ground in the writing operation so that the memory cells left unselected are prevented from passing the leakage current therethrough.

The transistors to be connected between the common source lines $Cs_1$ to $Cs_8$ and the ground may be limited to the depletion type MOSFETs $Q_{D1}$ to $Q_{D8}$. In the present embodiment, however, the resistances between the common source lines and the ground when in the reading operation can be dropped by connecting the enhancement type MOSFETs $Q_{N1}$ to $Q_{N8}$ in parallel with those depletion type MOSFETs $Q_{D1}$ to $Q_{D8}$.

The level difference between the data lines when in the reading operation can be enlarged as a result that the common source lines $Cs_1$ to $Cs_8$ have their resistances dropped.

With the common data lines $CDL_1$ to $CDL_8$ provided for the respective memory blocks 20a to 20h, the write circuits 28a to 28h are connected. The data is written in the respective memory cells by these write circuits 28a to 28h. The write circuits 28a to 28h conduct their writing operations on the basis of the mode designation signal EPM output from the mode exchange circuit 9 when the write voltage Vpp at a higher level (such as 12.5 V) than the supply voltage (i.e., 5 V) applied in the micon mode is applied to a predetermined pin, i.e., a pin shared with the signal pin in the micon mode and when the input state of the mode setting terminal 11 is judged to be in the EPROM mode by the mode exchange circuit shown in FIG. 3.

In the EPROM mode, more specifically, the write circuits 28a to 28h receive data $Din_0$ to $Din_7$ carried on the data bus 7b from the external of the micon at that time to apply the write voltages corresponding to those data to the common data lines $CDL_1$ to $CDL_8$ of the memory blocks 20a to 20h. The write voltages thus applied to the common data lines $CDL_1$ to $CDL_8$ are fed to a data line DL through a column switch Qc which is selectively turned on at that time by the Y-decoder 23.

In the EPROM mode, moreover, the X-decoder 22 feeds any one of the word lines with the selection signal at a higher level (e.g., 12.5 V) than the selection level (i.e., 5 V) in the micon mode.

Since the memory cell to be selected is written in that way, a selection signal as high as 12.5 V is applied to the control gate electrode of that memory cell by the X-decoder 22, and a write voltage as high as 12.5 V is fed to the drain terminal of the same through the column switch Qc and the data line DL by the write circuits 28a to 28h. As a result, the charges are injected into the floating gate of the memory cell selected, thus establishing the write state.

At this time, the control transistors $Qw_1$ to $Qw_8$ connected with the common data lines $CDL_1$ to $CDL_8$ have their respective gate terminals fed with the write control signal $\overline{we}$ at the low level such as about 0 V generated on the basis of the mode designation signal EPM output from the mode exchange circuit and the control signal $\overline{OE}$ input from the external side of the micon. In accordance with this, the control transistors $Qw_1$ to $Qw_8$ are cut off when the input potential of the read circuit exceeds about 3 V. As a result, the high write voltages fed from the write circuits 28a to 28h to the common data lines $CDL_1$ to $CDL_{16}$ are not transmitted to the read circuits 25a to 25h.

In the above-described case, moreover, the respective dummy memory cells composing the dummy memory array 21 are always required to give the data corresponding to the erased state to the dummy data line Dld, as will be described hereinafter. This makes it unnecessary to write the data in the dummy memory cells.

According to the present embodiment, the direct access to the EPROM by making use of the respective input/output ports is executed by the control making use of the external terminals 11, $\overline{RES}$ and $T_{30}$, as has been described hereinbefore.

According to the present embodiment, moreover, the EPROM 2 is dynamically operated in the micon mode. Next, the operations of the EPROM 2 in the micon mode will be described in the following. The timings of the input and output signals to and from the control circuit 27, which are required for understanding the operations of the EPROM 2 in the micon mode, will be described in more detail with reference to FIG. 5, although they have been summarized previously.

Figure 1:
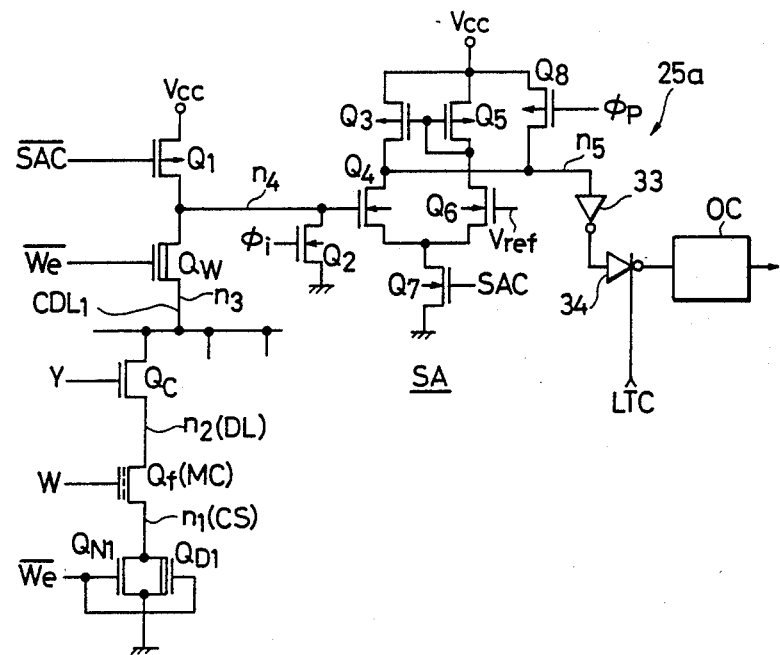
FIG. 1 is a circuit diagram showing one embodiment of a read circuit to be used in an LSI with a built-in EPROM according to the present invention.

In the state that the enable signal $\phi_E$ is output from the address decoder 10 of FIG. 3, the control signal $\overline{SAC}$ for the sense amplifier, which will be later described more specifically with reference to FIG. 1, is changed to the low level shown at E in FIG. 5, in synchronism with the fall of a clock $\phi_i$ generated in the control circuit 27 on the basis of the system clock pulse E shown at A in FIG. 5 and the internal clock signal $\phi_1$ shown at B in FIG. 5. The clock pulse $\phi_i$ is a signal which is changed in synchronism with the clock $\phi_1$ only during the low-level period of the system clock pulse E, as shown at D in FIG. 5. The control circuit 27 sends that clock pulse $\phi_i$ to the read circuits 25a to 25h and 26 to initialize them.

And, these read circuits 25a to 25h and 26 have their operations initialized by the control signal $\overline{SAC}$ changed to the high level in synchronism with the fall of the initializing clock $\phi_i$.

A precharge signal $\phi_p$ output from the control circuit 27 is changed to the low level, as shown at F in FIG. 5, in synchronism with the break of the control signal $\overline{SAC}$. Precharge operations of sense amplifiers (as will be described hereinafter) in the read circuits 25a to 25h and 26 are started by the precharge signal $\phi_p$. The control circuit 27 is equipped with level detection means (not shown) coupled to the dummy data line DLd through a line DDL. The dummy data line DLd starts to be precharged through the MOSFETs Qwd and Qcd when the precharging operation of the read circuit 26 is started by the low level of the precharge signal $\phi_p$. As a result, the level of the dummy data line DLd is so changed as is indicated at G in FIG. 5. That level detection means detects the precharge level of the dummy data line DLd. The precharge signal $\phi_p$ is raised to the high level, as shown at F in FIG. 5, in response to the output of the level detection means when the dummy data line DLd is raised to a predetermined level Vth or higher. When the precharge is ended in response to the return of the precharge signal $\phi_p$ to the high level, the drive signal $\phi_x$ of the X-decoder 22, which is output from the control circuit 27, is raised to the high level, as shown at H in FIG. 5. In response to this signal $\phi_x$, the X-decoder 22 is driven. As a result, the level of one word line W to be selected is raised to the high level, as shown at I in FIG. 5. As a result that the word line W is set at the selection level, the charges of the dummy data line DLd start to be released at a time constant which is determined by both the stray capacity of that dummy data line and the operation impedance of the dummy memory cells. The respective data lines are discharged in accordance with the ON and OFF states of the memory cells coupled to the word lines selected. After a predetermined period when the selections of the word lines are accordingly started, the read data $D_0$ to $D_7$ output from the read circuits 25a to 25h and dummy read data Dd output from the dummy read circuit 26 are changed.

The control circuit 27 monitors that dummy read data Dd to change the control signal $\overline{SAC}$ to the high level, at the instant when the level of the data Dd is so determined as is shown at J in FIG. 5, thereby to interrupt the operations of the read circuits 25a to 25h and 26.

The control circuit 27 also changes the control signal LTC, which is to be fed to the read circuits 25a to 25h and 26, to the high level, as shown at L in FIG. 5, in synchronism with the rise of the drive signal $\phi_x$ of the x-decoder 22. The latch circuits (as will be described hereinafter) in the read circuits 25a to 25h and 26 have their latching operations started to introduce the outputs of the sense amplifiers in response to the high level of the control signal LTC. This control signal LTC is changed to the low level synchronously as the operations of the read circuits 25a to 25h and 26 are interrupted in response to the rise of the control signal $\overline{SAC}$. As a result, the latch circuits interrupt their data latching operations so that they are transferred to the state in which they hold the data. While the latch circuits hold the data, the data of the read circuits 25a to 25h are output onto the data bus 7b.

Next, FIG. 1 shows both one example of the specific circuit construction of one 25a of the read circuits 25a to 25h and a portion of the memory array connected therewith.

Incidentally, it is assumed that the respective MOSFETs constructing the circuit are formed into the N-channel type, unless otherwise specified.

In order to facilitate the interpretation, there is representatively shown in the same figure both one FAMOS Qf composing one of the memory cells in the memory array and one of the plural column switches. The FAMOS Qf has its source terminal connected with a node $n_1$ and its drain terminal connected with a node $n_2$, and these nodes $n_1$ and $n_2$ correspond to a common source line CS and a data line DL in FIG. 4. The column switch Qc is connected with the node $n_2$ corresponding to the data line DL. Indicated at Qw is a write controlling transistor. As a result, a node $n_3$ connecting the column switch Qc and the transistor Qw corresponds to the common data line CDL.

The FAMOS Qf has its gate terminal fed with a selection signal X output from the X-decoder 22 of FIG. 4 through the word lines ($W_1$ to $W_{256}$), and the column switch Qc has its gate terminal fed with a selection signal Y output from the Y-decoder 23. Moreover, the write controlling transistor Qw has its gate terminal fed with the control signal $\overline{we}$.

The read circuit 25a is constructed of a sense amplifier SA, a latch circuit 34 and an output circuit OC. This output circuit OC is composed of a tri-state circuit which is connected between the latch circuit 34 and the data bus. The output circuit OC is rendered operative to output a data signal at a level corresponding to the output of the latch circuit 34 to the data bus 7b when the enable signal $\phi_E$ in FIG. 3 is raised to an enable level such as the high level and when the output enable signal $\overline{OE}$ is set at an enable level in the EPROM mode. The output circuit OC is rendered in-operative state or a high output impedance state when the enable signal $\phi_E$ and the output enable signal $\overline{OE}$ are set at a not enable level.

The sense amplifier SA is composed, as shown, of P-channel MOSFETs $Q_1$, $Q_3$, $Q_5$ and $Q_8$, N-channel MOSFETs $Q_2$, $Q_4$, $Q_6$ and $Q_7$, and a CMOS inverter 33, although the invention is not especially limited to this configuration.

The MOSFET $Q_1$ is switched by the control signal $\overline{SAC}$ so that it operates as a constant current source. The MOSFET $Q_2$ is switched by the signal $\phi_i$ to discharge a node $n_4$.

The MOSFETs $Q_3$ to $Q_7$ construct one differential amplifier as a whole. The P-channel MOSFETs $Q_3$ and $Q_5$ construct a current mirror load for the N-channel input differential amplification MOSFETs $Q_4$ and $Q_6$, and the N-channel MOSFET $Q_7$ constructs an operation current source.

The MOSFET $Q_4$ has its gate coupled to the node $n_4$, and the MOSFET $Q_6$ has its gate coupled to a reference voltage source (not-shown). This reference voltage source is constructed of a resistance voltage-dividing circuit (not-shown), for example, although the invention is not especially limited to this configuration, to output a reference voltage $V_{ref}$ at a suitable level, which is to be fed to the differential amplifier, in response to a supply voltage Vcc.

The MOSFET $Q_8$ is a precharge MOSFET.

The operations of the read circuit 25a thus constructed will be described in the following.

First of all, when the clock $\phi_i$ is set at the high level, as shown at D in FIG. 5, the MOSFET $Q_2$ is accordingly turned on. The node $n_4$ is initialized to nearly 0 V by the MOSFET $Q_2$.

Next, the control signal $\overline{SAC}$ and the precharge signal $\phi_p$ break to the low levels, as shown at E and F in FIG. 5, synchronously as the clock pulse $\phi_i$ breaks to the low level. A control signal SAC is raised to the high level, as shown at E in FIG. 5, synchronously as the control signal $\overline{SAC}$ falls to the low level.

The MOSFET $Q_7$ is rendered conductive in response to the high level of the control signal SAC. In response to this, the operation current starts to be fed to the differential amplifier. Since, in this case, the MOSFET $Q_8$ is turned on by the precharge signal $\phi_p$ at the low level, the potential of an output node $n_5$ is raised to the precharge level (or at the high level). When the signal $\phi_p$ and SAC are set at the aforementioned timings, the operation current will flow through that differential amplifier irrespective of the precharge level of the output node $n_5$ of the differential amplifier. This operation current to be generated during the precharge period can be reduced substantially to zero by delaying the timing, at which the control signal SAC, for example, is raised to the high level, to substantially the same or more delayed timing as that at which the precharge charge signal $\phi_p$ is raised again to the high level. In this case, however, it should be noted that the circuit (not-shown) for generating the control signal SAC is relatively complicated.

The MOSFET $Q_2$ of FIG. 1 is turned off in response to the low level of the timing signal $\phi_i$, as shown at D in FIG. 5.

The precharging MOSFET $Q_1$ is rendered conductive in response to the low level of the control signal $\overline{SAC}$, as shown at E in FIG. 5. As a result, the node $n_4$ starts to be charged through the MOSFET $Q_1$.

Here, the address signals $A_0$ to $A_{11}$ to be fed to the address bus 7a of FIG. 4 have their respective levels determined in synchronism with the low level of the system clock E, as indicated at A in FIG. 5. In accordance with this, the output of the Y-decoder 23 has already its level determined prior to the low level of the signal $\overline{SAC}$. In other words, one column switch corresponding to the address signals $A_8$ to $A_{11}$ is turned on.

Therefore, a selected data line DL (or the node $n_2$) starts to be precharged through the controlling MOSFET Qw and the column switch Qc when the control signal $\overline{SAC}$ is dropped to the low level.

The read circuit 26 in FIG. 4 is made to have substantially the same construction as the read circuit 25a in FIG. 1. As a result, the data line (which will be referred to as the "dummy data line") in the dummy memory array 21 in FIG. 4 starts to be charged at the same timing as the data line of the memory array to be selected. Although the invention is not especially limited to this configuration, the MOSFETs Qcd and Qwd connected between the dummy data line DLd and the read circuit 26 are caused to have substantially the same impedances as those of the column switch Qc and the controlling MOSFET Qw.

Therefore, the precharge state of the data line of the memory array to be selected can be simulated by the dummy data line DLd.

The level of this dummy data line DLD is monitored by the control circuit 27 in FIG. 4. When the precharge level of the dummy data line DLd reaches the predetermined level Vth, as indicated at G in FIG. 5, the precharge signal $\phi_p$ to be output from the control circuit 27 is accordingly returned to the high level, as shown at F in FIG. 5, and the drive signal $\phi_x$ is changed from the low level to the high level, as indicated at B in FIG. 5.

The precharging $Q_8$ coupled to the output node $n_5$ of the differential amplifier is turned off in response to the high level of the signal $\phi_p$. The X-decoder 22 in FIG. 4 is rendered operative in response to the high level of the drive signal $\phi_x$, as indicated at H in FIG. 5. In response to this, such one of the plural word lines $W_1$ to $W_{256}$ as corresponds to the address signals $A_0$ to $A_7$ is set at the selection level (i.e., the high level) substantially equal to the supply voltage Vcc.

Here, the FAMOS Qf acting as the memory cell has one of the higher and lower threshold voltages in accordance with the previous write data, as has been described hereinbefore.

When the FAMOS Qf has the higher threshold voltage, it is maintained in its OFF state even if the word lines are set at the selection level. In this case, therefore, no d.c. current path is formed between the circuit node $n_4$ of FIG. 1 and the ground point of the circuit. The node $n_4$ is left at the precharge (or high) level. Likewise, the data line DL (or the node $n_2$) is left at the precharge level.

If the FAMOS Qf has the lower threshold voltage, on the contrary, it is turned on in response to the selection level of the words. In this case, therefore, there is formed between the circuit node $n_4$ and the ground point of the circuit a d.c. current path which is composed of the controlling MOSFET Qw, the column switch Qc, the FAMOS Qf and the MOSFETs $Q_{N1}$ and $Q_{D1}$. As a result, if the word lines are selected, the data line DL and the node $n_4$ accordingly start to have their respective levels dropped.

In order to detect whether or not the levels of the node $n_4$ and the data line DL have been changed from the precharge level to a readable level, according to the present embodiment, reference is made to the level of the dummy data line DLd.

Each FAMOS transistor in the dummy memory array 21 is brought into the unwritten state, as has been described hereinbefore, to have the lower threshold voltage.

Therefore, if one of the word lines is selected, the dummy data line DLd has its potential dropped, as indicated at G in FIG. 5, because its charges start to be released through the FAMOS transistors. The dummy data line DLd has its level detected by the read circuit 26.

The output of the read circuit 26 is changed from the low level to the high level, as indicated at J in FIG. 5, in response to the reduction of the level of the dummy data line DLd from a predetermined level.

The control circuit 27 changes the control signals $\overline{SAC}$ and SAC, respectively, to the high and low levels, as indicated at E in FIG. 5, in response to the high level of the output of the read circuit 26.

As a result, the precharge MOSFET $Q_1$ is rendered non-conductive so that the differential amplifier is rendered inoperative. The threshold voltage of the read circuit 26 may be made slightly higher than that of the read circuit 25a while considering the operation delay of the control circuit 27.

The latch control signal LTC for controlling the operations of the latch circuit constructed of the CMOS clocked inverter 34 is raised to the high level on the basis of the monitor result of the dummy memory array, as indicated at L in FIG. 5, and is dropped to the low level before the control signals $\overline{SAC}$ and SAC are returned to the high and low levels, respectively, although the invention is not especially limited to that configuration. The clocked inverter 34 outputs a signal at a level corresponding to the previous input signal irrespective of the input signal, if the latch control signal LTC is set at the high level, and introduces the input signal at that time if the control signal LTC is set at the low level. Therefore, the output of the clocked inverter 34 is changed, as indicated at K in FIG. 5, in accordance with the changes in the control signal LTC.

Figure 2:
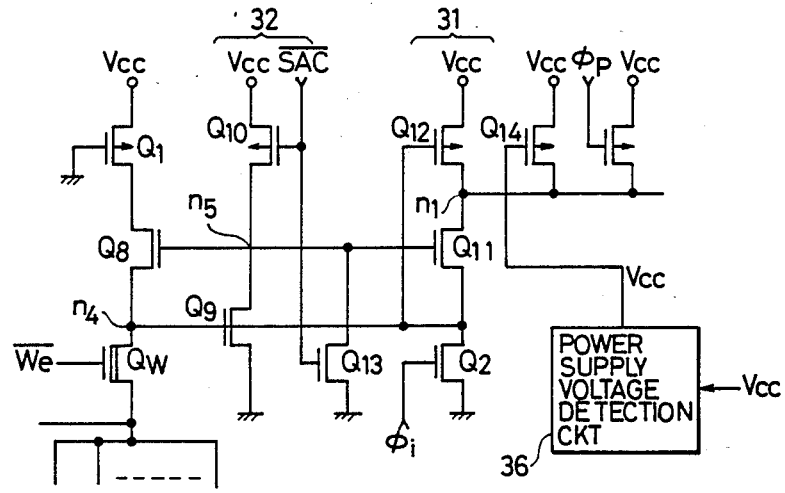
FIG. 2 is a circuit diagram showing another read circuit.

FIG. 2 is a circuit diagram showing a sense amplifier which can replace the sense amplifier SA of FIG. 1.

In this embodiment, between the drain terminal (or the node $n_4$) of the controlling transistor Qw and the supply voltage Vcc, there are connected in series the constant current MOSFET $Q_1$ for feeding the read currents to the respective data lines through the column switch Qc and the current controlling MOSFET $Q_8$ for controlling those currents. Of these, the MOSFET $Q_1$ is formed into the P-channel type to act as the constant current source when the ground potential is applied to the gate terminal thereof.

The node $n_4$ is equipped with a level detection circuit 31 for detecting the level of the data line DL (or the node $n_3$) selected, and a feedback circuit 32 for adjusting the gate voltage of the current controlling MOSFET $Q_8$ in accordance with the level of the data line DL to control the currents flowing toward the data lines.

The feedback circuit 32 is composed of the MOSFET $Q_9$ having its gate terminal connected with the node $n_4$ to have its current controlled by the potential of the data line DL, and the P-channel type MOSFET $Q_{10}$ having its gate terminal fed with the control signal $\overline{SAC}$ output from the control circuit 27. And, the potential at the node $n_5$ connecting the MOSFETs $Q_9$ and $Q_{10}$ is applied to the gate terminal of the current controlling MOSFET $Q_8$.

The level detection circuit 31 is composed of the MOSFET $Q_{11}$ having its source terminal connected with the node $n_4$, and the P-channel type load MOSFET $Q_{12}$ connected between the drain terminal of that MOSFET $Q_{11}$ and the supply voltage Vcc. The MOSFET $Q_5$ has its gate terminal fed with the potential of the node $n_5$ in the feedback circuit 32 so that it is turned on and off like the current controlling MOSFET $Q_8$ connected with the data line. The MOSFET $Q_{12}$ has its gate terminal fed with the potential of the node $n_4$, to which the read level of the data line is output, so that it acts as a variable resistance type of load element.

The level detection circuit 31 and the feedback circuit 32 described above construct together the so-called "sense amplifier". In this sense amplifier, in addition to the MOSFETs $Q_9$ to $Q_{13}$, the discharge MOSFETs $Q_2$ and $Q_{13}$ are connected between the node $n_4$ and the ground point and between the node $n_5$ and the ground point, respectively.

One discharge MOSFET $Q_2$ has its gate terminal fed with the initialize clock pulse $\phi_i$, which is also fed to the control circuit 27, so that it extracts the charges of the node $n_4$ prior to the start of the operations of the sense amplifier or prior to the break of the control signals $\overline{SAC}$. The other discharge MOSFET $Q_{13}$ has its gate terminal fed with the control signal $\overline{SAC}$ output from the control circuit 27 so that it is turned on prior to the operation of the sense amplifier to extract the charges of the node $n_5$ thereby to set the sense amplifier in the interrupted state. When the control signal $\overline{SAC}$ is changed to the low level so that the sense amplifier starts to be operated, the MOSFETs $Q_2$ and $Q_{13}$ are turned off to exert no influence upon the operations of the circuit.

With the output node of the level detection circuit 31, i.e., a node $n_6$ connecting the MOSFETs $Q_{11}$ and $Q_{12}$, the waveform shaping inverter 33 is connected, the output of the inverter being input to the clocked inverter 34 acting as the latch circuit. Moreover, the output of that clocked inverter 34 is amplified and inverted by a data output inverter 35 until it is output to the data bus 7b.

The individual inverters 33 to 35 are formed into the CMOS (i.e., Complementary MOS) type, although the invention is not especially limited to this configuration. The clocked inverter 34 is controlled to conduct the latch operation by the control signal LTC coming from the control circuit 27.

Between the node $n_6$ in the level detection circuit 31 and the supply voltage Vcc, moreover, there are connected an output level correcting MOSFET $Q_{14}$ and a precharge MOSFET Qp. These MOSFETs $Q_{14}$ and Qp are formed into the P-channel type. The precharge MOSFET Qp has its gate terminal fed with the precharge signal $\phi_p$ output from the control circuit 27 so that the node $n_6$ is first boosted to the supply voltage Vcc by that precharge signal $\phi_p$ when the control signal $\overline{SAC}$ is changed from the high level to the low level to start the operation of the sense amplifier. As a result, the read data outputs $D_0$ to $D_7$ are always first set at the low level.

The output level correcting MOSFET $Q_9$ has its gate terminal fed with the output voltage Vco of a supply voltage detection circuit 36 which is made operative to detect the level of the supply voltage Vcc to output a voltage according thereto. As a result, the output of the sense amplifier, i.e., the level detection circuit 31 is corrected in accordance with the level of the supply voltage Vcc, as will be described in detail hereinafter.

Next, the operation of the read circuit having the construction thus far described will be explained in the following.

When the control signal $\overline{SAC}$ fed from the control circuit 27 changes from the high level to the low level, the MOSFET $Q_{10}$ is turned on, and the MOSFET $Q_{13}$ is turned off so that the operation of the sense amplifier is started. More specifically, the charges flow to the node $n_5$ through the MOSFET $Q_{10}$, which is turned on by the control signal $\overline{SAC}$, to boost the level of the node $n_5$. As a result, the MOSFET $Q_8$ is turned on so that the current fed from the constant current MOSFET $Q_1$ flows into the node $n_4$. Till then, moreover, one column switch Qc corresponding to the addresses $A_8$ to $A_{11}$ is turned on by the Y-decoder 23. As a result, the current having flown into the node $n_4$ flows into the data line DL through the column switch Qc selected to charge up the data line.

Since the MOSFET $Q_{11}$ is also turned on at that time, the precharge is effected from the side of the output node $n_6$ of the sense amplifier by the precharge signal $\phi_p$, as has been described hereinbefore. As a result, the precharge of the data line DL is promptly conducted.

Moreover, the precharge of the data line is also conducted within the dummy memory array 21, and the control circuit 27 monitors the level of the data line DLd in that dummy memory array 21 to raise the precharge signal $\phi_p$ thereby to end the precharge when the level monitored exceeds a predetermined level. On the other hand, the drive signal $\phi_x$ output from the control circuit 27 in synchronism with the rise of the precharge signal $\phi_p$ is changed to the high level to drive the X-decoder 22 so that the level of one word line selected is raised.

At the ending instant of the precharge, moreover, the control signal LTC to be fed to the clocked inverter 34 is changed to the high level so that the output of the sense amplifier starts to be introduced. Since, however, the output of the sense amplifier at the instant when the clocked inverter 34 starts the latching operation is initially set at the high level by the precharge, the output of the output inverter 35 is first at the low level.

When the word line start to rise after the end of the precharge in the aforementioned manner, the threshold voltage is different depending upon whether the FAMOS Qf of the memory cell selected is in the write state or in the erased state so that a difference arises in the potential of the data line DL (or the node $n_2$). If the FAMOS Qf selected is in the write state, the FAMOS Qf is turned off at the selection level (about 5 V) of the word line so that the potential of the data line DL (or the node $n_2$) is the same as that at the end of the precharge. If the FAMOS Qf selected is in the erased state, on the other hand, the FAMOS Qf is turned on to drop the potential of the data line DL.

When the potential of the data line DL thus changed is transmitted to the node $n_4$ through the column switch Qc and the write controlling transistor Qw, the MOSFET $Q_9$ in the feedback circuit 32 is turned on more strongly for the higher data line potential. When the MOSFET $Q_9$ is turned on strongly, moreover, the potential of the node $n_5$ is dropped so that the current controlling MOSFET $Q_8$ is transferred in the direction of interruption.

As a result, if the FAMOS Qf selected is in the write state, the MOSFET $Q_8$ is cut off to limit the current flowing toward the data line DL so that the potential of the node $n_4$ comes into a balanced state at a high level. If the FAMOS Qf is in the erased state, the data line potential becomes lower to turn on the MOSFET $Q_9$ weakly, because the FAMOS Qf is in its conducting state, so that the potential of the node $n_3$ is raised to turn on the MOSFET $Q_8$ continuously. Then, the constant current fed from the constant current MOSFET $Q_1$ flows to the ground point through the MOSFETs $Q_8$, Qw and Qc and the FAMOS Qf and further through MOSFETs $Q_{11}$ and $Q_{12}$. As a result, the potential of the node $n_4$ is drawn toward the FAMOS Qf of lower impedance into its balanced state at the low level.

Thus, the MOSFET $Q_{11}$ connected with the node $n_4$ and composing the level detection circuit 31 is operated in absolutely the same manner as the MOSFET $Q_8$ by the potential of the node $n_5$. As a result, if the FAMOS Qf selected in the write state, the MOSFET $Q_{11}$ is cut off by the node $n_4$ at the relatively high potential so that the potential of the output node $n_6$ is held at the high level. If the FAMOS Qf selected is in the erased state, the potential of the output node $n_6$ is dropped by the potential of the node $n_4$ so that the waveform shaping inverter 33 has its output inverted.

Thus, at timing that the output of the sense amplifier is to be determined, the control circuit 27 for monitoring the read data (i.e., the output of the inverter 35) of the dummy memory array 21, which is always inverted in dependence upon the data line level, detects the inversion of the read data at the dummy side to change the latch control signal LTC from the high level to the low level. As a result, the clocked inverter 34 releases the latched state of the output of the sense amplifier (i.e., the inverter 33) to hold the data latched just before.

In synchronism with the break of that latch control signal LTC, moreover, the control signal $\overline{SAC}$ output from the control circuit 27 is changed from the low level to the high level. Then, the MOSFET $Q_{10}$ is cut off so that no current flows through the feedback circuit 32, and the MOSFET $Q_{13}$ is turned on to fix the node $n_5$ at the low level whereas the MOSFET $Q_{11}$ is turned off so that no current flows through the level detection circuit 31 to interrupt the operation of the sense amplifier.

Thus, although the sense amplifier is constructed of the CMOS circuit, according to the embodiment, the current caused to flow through the feedback circuit and the level detection circuit 31 during the circuit operation is limited to the time period for which the sense amplifier is operated by the control signal $\overline{SAC}$. Since the operation period of the sense amplifier, i.e., the period for which the control signal SAC is at the low level is reduced to the minimum required by the control circuit 27, the power consumption of the sense amplifier is markedly reduced.

Since the MOSFET $Q_8$ is also turned off when the control signal $\overline{SAC}$ is raised to the high level, the current to flow toward the data line, when the memory cell selected is in the write operation, is cut so that the current consumption of the whole memory array during the reading operation is accordingly reduced. Moreover, according to the embodiment thus far described, the operation period of the sense amplifier is relatively shortened, when the internal clock signals $\phi_1$ and $\phi_2$ have their periods elongated, to provide an advantage that the effect of the power consumption reduction is enhanced.

Next, the operation of the MOSFET $Q_{14}$ for correcting the output level of the sense amplifier will be described further, although it has been briefly mentioned.

Figure 6:
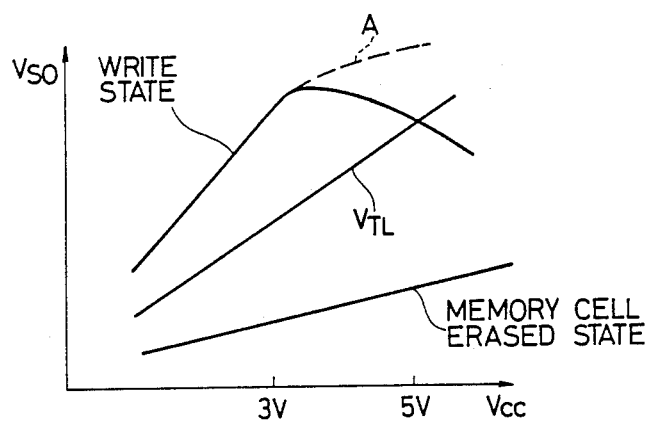
FIG. 6 is a graph showing a characteristic curve indicating the dependency of the output of the sense amplifier of the aforementioned embodiment upon a supply voltage.

In the case that the data line level is to be detected by means of the sense amplifier constructed of the level detection circuit 31 and the feedback circuit 32, as has been described in the embodiment, if the memory cell causes an insufficient writing operation so that the threshold voltage of the FAMOS Qf is lower than the selection level (Vcc) of the word line, then the sense amplifier output (i.e., the potential of the node $n_6$) $V_{SO}$, when the memory cell in the write state is read, is dropped to a level lower than the logic threshould voltage $V_{LT}$ of the inverter 33 of the subsequent stage in accordance with the rise in the supply voltage Vcc, as shown in FIG. 6. This may result in data being read out erroneously.

Figure 7:
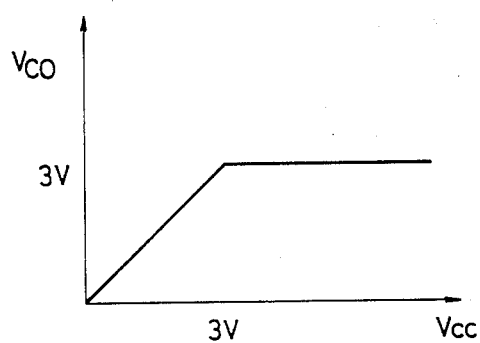
FIG. 7 is a graph showing a characteristic curve indicating one example of the characteristics of a control voltage Vco to be applied to the gate of MOSFET for correcting the output level of the sense amplifier if the supply voltage Vcc fluctuates.

In the embodiment, therefore, the level of the supply voltage Vcc is detected by the supply voltage detection circuit 36, and a control voltage Vco having the characteristics shown in FIG. 7, for example, is generated in accordance with that level and is applied to the gate of the output level correcting MOSFET $Q_{14}$. As a result, when the supply voltage Vcc effects the sense amplifier operation at the higher level, the output of the sense amplifier is corrected to rise with such a tendency as is indicated by a broken curve A in FIG. 6.

The voltage characteristics shown in FIG. 7 are presented by way of example so that they are variable in dependence upon the characteristics, sizes and so on of the elements (e.g., the MOSFETs $Q_9$ to $Q_{12}$) composing the sense amplifier. In short, the control voltage Vco may be so generated that the output characteristics shown in FIG. 6 may be consequently obtained in relation to the characteristics of the sense amplifier.

If the memory cell is insufficiently written to so that the threshold value is not sufficiently raised, the reading time period may be elongated, because the memory cell is slightly turned on by the word line section level in the reading operation to make the data line level rise sluggishly. Despite this fact, however, the embodiment has another advantage in that a satisfactory reading operation can be conducted by promptly raising the data line level through the precharge, because the precharge MOSFET Qp is provided to precharge the word line in the unselected state.

The embodiment thus far described is constructed such that the memory array is divided into the eight blocks for which the read circuits are provided, respectively, so that the data of 8 bits may be read out in parallel. The bit structure of the memory array should not be limited thereto but can naturally have 1 bit, 4 bits or 16 bits, for example.

The sense amplifier output level correcting MOSFET $Q_{14}$ and the precharge MOSFET $Q_p$ of this embodiment can be omitted.

Moreover, the system of determining the operation interrupting timing of the sense amplifier by providing the dummy memory array can be applied not only to the EPROM of the single-chip micon but also to the single device EPROM (e.g., a semiconductor memory) or the like.

The specific example of the X-decoder 22 in FIG. 4 will be described in detail in a second embodiment because it is made substantially the same as that of the second embodiment.

[Embodiment 2]

Figure 9:
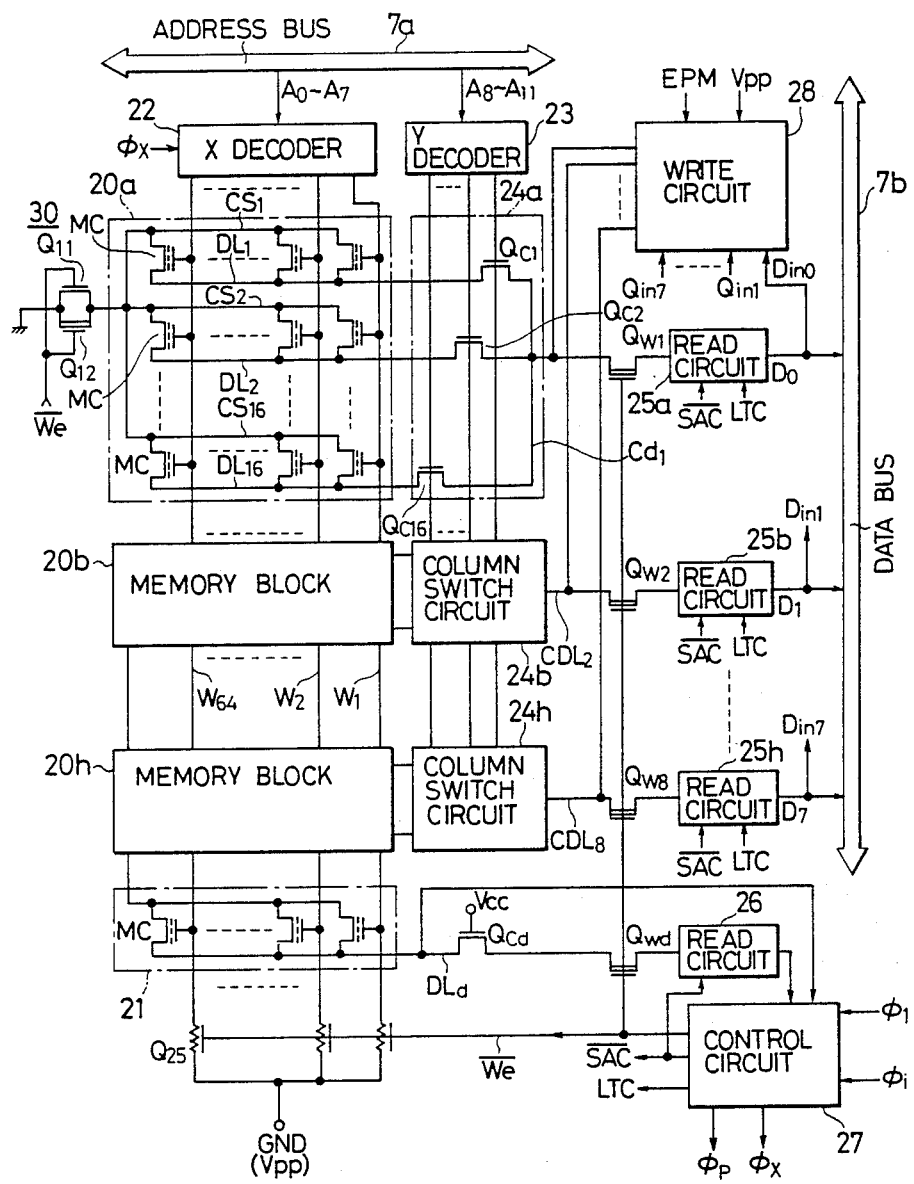
FIG. 9 is a circuit diagram showing an on-chip EPROM according to another embodiment.

FIG. 9 is a block diagram showing an EPROM according to the second embodiment.

The EPROM in the same figure is constructed, as is different from the one in FIG. 4, such that its eight memory blocks 20a to 20h have their source terminals shared thereamong and are coupled to one variable impedance circuit 30 which is composed of the enhancement mode MOSFET $Q_{11}$ and the depletion MOSFET $Q_{12}$.

Moreover, the depletion mode MOSFET Qwd is held at the level of the control signal $\overline{we}$ although its gate terminal is held at the supply voltage Vcc. As a result, the conductance of the MOSFET Qwd is changed in accordance with the level of the control signal $\overline{we}$ like the MOSFETs $Qw_1$ to $Qw_8$.

Thus, the EPROM in FIG. 9 is partially different from that of the EPROM in FIG. 4. However, the operations of the EPROM in FIG. 9 are made substantially the same as those of the EPROM in FIG. 4.

Therefore, the description of the operations of the EPROM in FIG. 9 is omitted.

Figure 8:
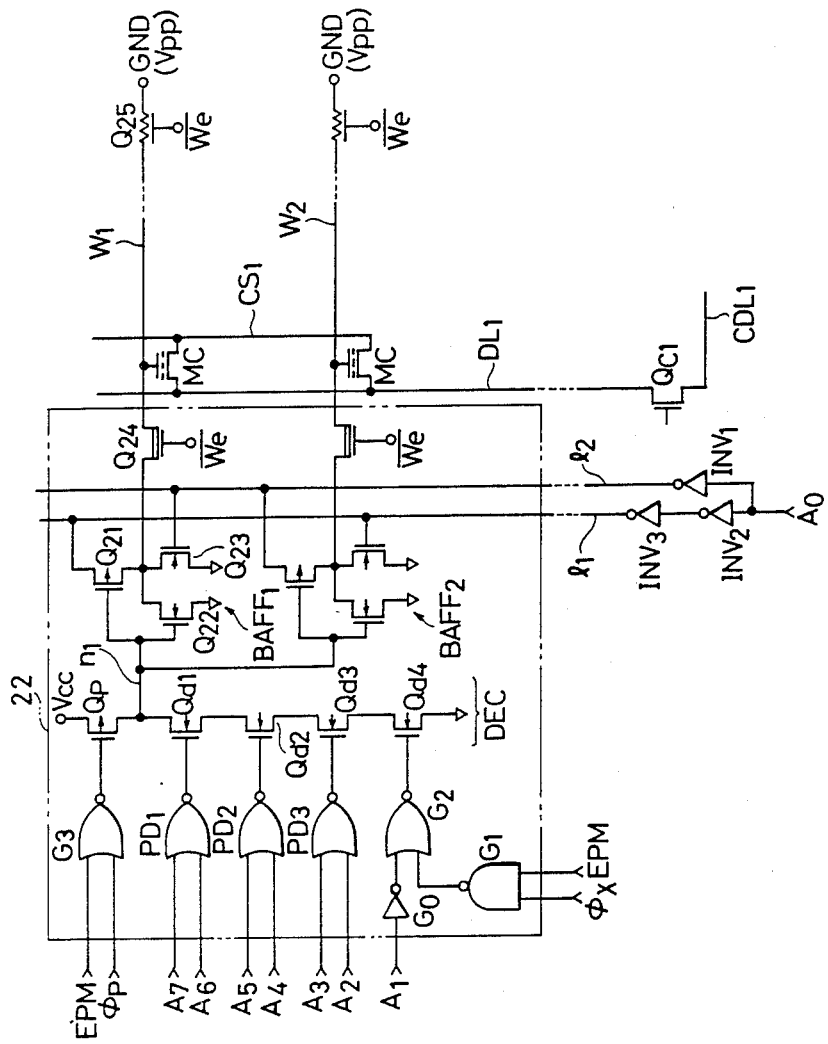
FIG. 8 is a circuit diagram showing an X-decoder.

FIG. 8 shows one example of the specific circuit construction of the X-decoder 22 in FIG. 9 and a portion of the memory array connected therewith.

Here, although the invention is not especially limited to this configuration, among the address signals $A_0$ to $A_{11}$ fed from the address bus 7a in FIG. 9, the address signals $A_0$ to $A_7$ are input to the X-decoder 22. The address signals $A_6$ and $A_7$, $A_4$ and $A_5$, and $A_2$ and $A_3$ are decoded, respectively, by predecoders $PD_1$, $PD_2$ and $PD_3$ constructed of NOR gate circuits for feeding their respective output signals $(A_6 * A_7)$, $(A_4 * A_5)$ and $(A_2 * A_3)$ to a main decoder DEC.

The main decoder DEC is constructed into the CMOS type NAND circuit which is composed of: a precharge P-channel type MOSFET $Q_p$ connected between the power supply terminal Vcc and the output node $n_1$; and four N-channel type MOSFETs $Qd_1$ to $Qd_4$ connected in series between the output node $n_1$ and the ground point of the circuit.

Figure 10:
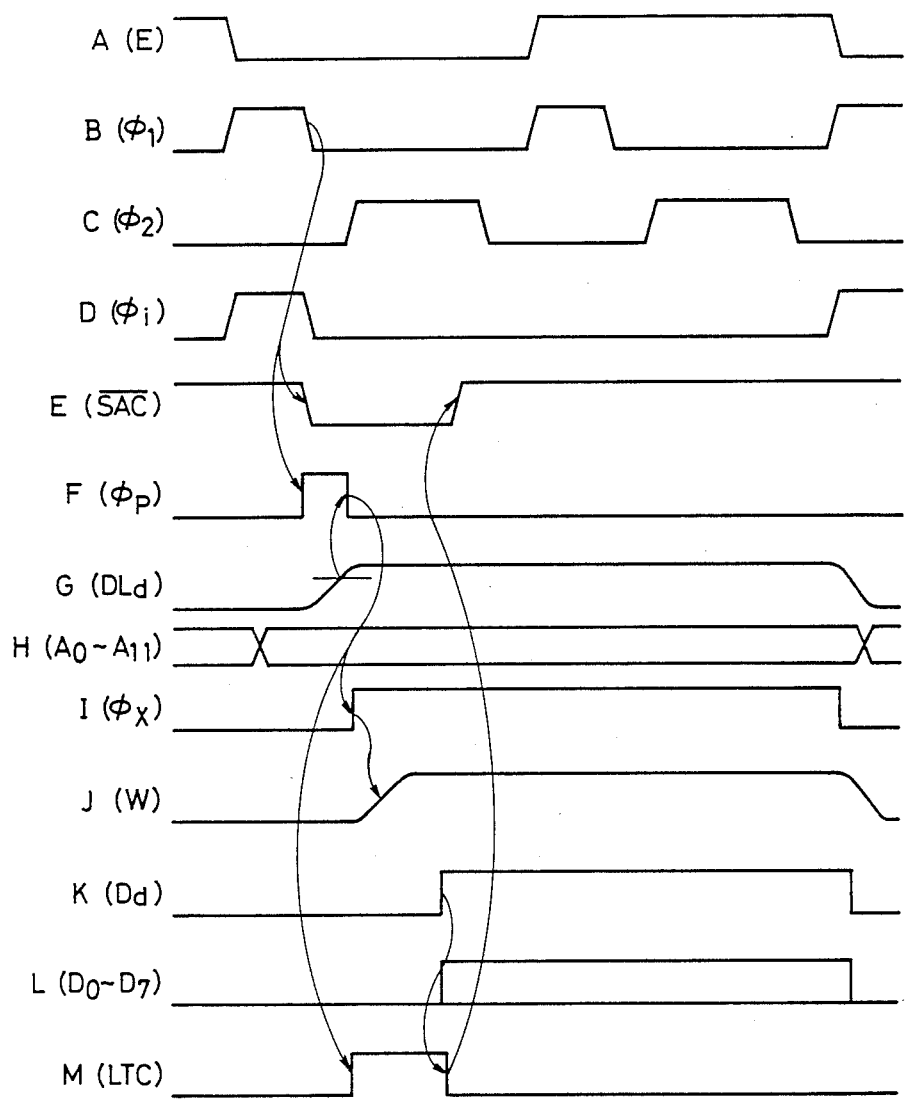
FIGS. 10 and 11 are timing charts of the EPROM of FIG. 9.
Figure 11:
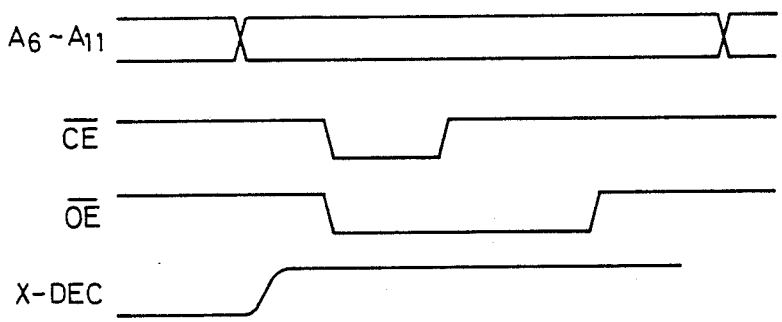

The MOSFETs $Qd_1$, $Qd_2$ and $Qd_3$ of the aforementioned ones $Qd_1$ to $Qd_4$ have their gate terminals fed with the output signals $(A_6 * A_7)$, $(A_4 * A_5)$ and $(A_2 * A_3)$ of the predecoders $PD_1$, $PD_2$ and $PD_3$, respectively. On the other hand, the MOSFET $Qd_4$ has its gate terminal fed with both the output signal of a NAND gate circuit $G_1$ for taking the logic AND between the mode designation signal EPM fed from the mode exchange circuit 9 and the word line drive signal $\phi_x$ fed from the control circuit 27, and the output signal of a NOR gate circuit $G_2$ made receptive to an address signal $a_1$ or $\overline{a_1}$. The control signal $\phi_x$ is raised in the micon mode to the high level in synchronism with the precharge control signal $\phi_p$, as will be described with reference to I in FIG. 10. The control signal $\phi_x$ is raised to the high level, too, in the direct EPROM access mode together with the control signal EPM. The address signals $a_1$ and $\overline{a_1}$ are generated by passing the address $A_1$ through an inverter $G_0$.

Moreover, the precharge MOSFET $Q_p$ has its gate terminal fed with the output signal of a NOR gate $G_3$ which is made receptive to the mode designation signal EPM and the precharge signal $\phi_p$ fed from the control circuit 27. As a result, the main decoder DEC generates the decode signals of the addresses $A_1$ to $A_7$.

Moreover, the output signal of that main decoder DEC is fed commonly to a pair of word lines driving buffers $BAFF_1$ and $BAFF_2$ having decoding functions. These buffers $BAFF_1$ and $BAFF_2$ are composed of one P-channel type $\phi_{21}$, and two N-channel type MOSFETs $Q_{22}$ and $Q_{23}$ connected in parallel between the drain terminal of that MOSFET $Q_{21}$ and the ground point of the circuit. The MOSFETs $Q_{21}$ and $Q_{22}$ have their gate terminals fed with the output signal of the main decoder DEC. The P-channel type MOSFET $Q_{21}$ in the buffers $BAFF_1$ and $BAFF_2$ has its source terminal coupled to a signal line $l_1$ and $l_2$ to which an address signal $\overline{A_o}$ or its inverted signal Ao is fed through inverters $INV_1$ to $INV_3$. The signal which is inverted into an opposite phase with respect to the signal fed to the source terminal of the MOSFET $Q_{21}$ is applied to the gate terminal of the MOSFET $Q_{23}$.

As a result, when the output of the main decoder DEC is at the low level, only one of the output signals of the buffers $BAFF_1$ and $BAFF_2$ is changed from the low level to the high level in accordance with the address signal Ao so that the corresponding word line is brought into its selection level.

Only the two paired word lines $W_1$ and $W_2$ of the 256 word lines are shown by way of representation, but the remaining word lines are connected with similar buffer circuits, respectively.

The respective buffers $BAFF_1$, $BAFF_2$ and so on have their output terminals connected with the corresponding word lines W through respective depletion mode MOSFETs $Q_{24}$. To the end portion of each word line W, moreover, is applied either the ground potential GND or the write voltage Vpp through a polycrystalline silicon type switch MOSFET $Q_{25}$, for example, although the invention is not especially limited to this configuration.

The polycrystalline silicon type MOSFET $Q_{25}$ has a pair of P-type semiconduct or regions, which are formed to act as source and drain regions by selectively introducing an impurity into a polycrystalline silicon layer formed on a semiconductor substrate through an insulating film, and an intrinsic region interposed to act as a channel forming region between those paired P-type semiconductor regions. The gate electrode is constructed of a conductor layer such as an impurity-diffused layer formed on the surface of the semiconductor substrate below the intrinsic region or an aluminum electrode layer formed on the intrinsic region through an insulating film. As a result, the intrinsic region between the paired P-type semiconductor regions is formed with a channel in accordance with the voltage applied to either a diffusion layer acting as the gate electrode or an aluminum electrode layer.

The MOSFETs $Q_{24}$ and $Q_{25}$ have their gate terminals fed, respectively, with the write control signal $\overline{we}$ which in turn is fed from the control circuit 27. As a result, when in the micon mode, for example, the write control signal $\overline{we}$ is raised to the high level so that the depletion mode MOSFET $Q_{24}$ is rendered conductive, but the polycrystalline silicon type MOSFET $Q_{25}$ is remained in cut off state. As a result, the drive of the word lines to the selection level by the buffers BAFF is promptly conducted.

In the EPROM mode, the write control signal $\overline{we}$ is dropped to the low level so that the polycrystalline silicon type MOSFET $Q_{25}$ is rendered conductive to feed the write voltage Vpp to the word line. Moreover, the depletion mode MOSFET $Q_{24}$ has its gate terminal fed with the ground potential. If, in this state, the output of the buffer BAFF is raised to the high level, the gate voltage of the MOSFET $Q_{24}$ is made negative with respect to that high level so that the MOSFET $Q_{24}$ is interrupted. In response to the cut-off state of the MOSFET $Q_{24}$, the word line coupled thereto has its potential boosted to the write voltage level in accordance with the write voltage Vpp which is fed from one end terminal side thereof through the MOSFET $Q_{25}$.

Conversely, when the output of the buffer BAFF is at the low level, the depletion mode MOSFET $Q_{24}$ is at a voltage of 0 V between its gate and source so that it is rendered conductive. As a result, even if the write voltage Vpp is fed through the MOSFET $Q_{25}$, the potential of the word line is forced to the low level by the ground side MOSFET ($Q_{22}$ or $Q_{23}$) which is turned on in the buffer BAFF. Thus, in the EPROM mode, only one word line selected by the buffer BAFF is boosted to the write voltage Vpp.

In the X-decoder 22 of the present embodiment, in the micon mode in which the mode designation signal EPM is fixed at the low level, the MOSFET Qp is turned on to precharge the main decoder DEC only when the precharge singal $\phi_p$ fed through the NOR gate $G_3$ is changed to the high level. The address signals $A_1$ to $A_7$ are decoded as a result that the node $n_1$ is discharged or not in response to the output signals of the predecoders $PD_1$ to $PD_3$ and the gate $G_2$ coming from the main decoder DEC and in synchronism with the rise of the word line drive signal $\phi_x$.

In the EPROM mode in which the mode designation signal EPM is fixed at the high level, the precharge MOSFET Qp is turned on at all times by the output of the gate $G_3$ so that the node $n_1$ is held at the high level. When all the MOSFETs $Q_{d1}$ to $Q_{d4}$ are turned on by the address signals $A_1$ to $A_7$, moreover, the output of the main decoder DEC is changed to the low level by the ratios of the ON resistances of the MOSFET Qp to the MOSFETs $Q_{d1}$ to $Q_{d4}$. In the above case, by making the element sizes of the MOSFETs $Q_{d1}$ to $Q_{d4}$ larger than that of the precharge MOSFET Qp, the node $n_1$ can be dropped sufficiently near the ground potential when the MOSFETs $Q_{d1}$ to $Q_{d4}$ are turned on. In other words, the MOSFET Qp acts as a load MOS in the EPROM mode.

Thus, the X-decoder of the present embodiment is dynamically operated in the micon mode of the main decoder DEC and statically operated in the EPROM mode. As a result, the current consumption in the micon mode can be made smaller than that when the X-decoder is formed into a completely static type. The timing signal necessary for the dynamic operation can be easily generated by using the clocks $\phi_1$, $\phi_2$ and so on in the single-chip micon. In the EPROM mode, there flows through one X-decoder a through current which has a value as low as about 100 $\mu$A, for example, but this current increase creates no problems because the power supply of the EPROM writer is required to have a sufficient capacity.

In the EPROM mode, no clock pulse is generated inside of the micon, but the X-decoder 22 conducts its static operation to make it unnecessary to provide such a circuit inside as to generate the timing signal (e.g., $\phi_p$ or $\phi_x$) necessary for the dynamic operation. Since such timing signal need not be generated and fed by the EPROM writer or another external circuit, moreover, the EPROM in the micon can be written by using the existing EPROM writer.

As a result, according to the present embodiment, it is possible to reduce the power consumption in the micon mode without increasing the chip size and to facilitate the writing operation of the EPROM. Since a portion (e.g., the main decoder DEC) of the X-decoder is formed into the dynamic type, moreover, the number of the elements composing the decoder is reduced together with the area occupied by the whole decoder so that the chip size can be accordingly reduced. Since the number of the elements of the main decoder DEC is small, the loads upon the predecoders $PD_1$ to $PD_3$ are lightened to speed up the operations.

In the present embodiment, furthermore, the X-decoder 22 is constructed of the predecoders $PD_1$ to $PD_3$, the main decoder DEC, and the word line driving buffer BAFF having the decoding function and is caused to decode the address in the three stages. Especially in the main decoder DEC, therefore, the number of the elements of the N-channel type MOSFETs connected in series between the output node $n_1$ and the ground point is decreased and the main decoder is made narrower. As a result, the respective decoders can be arranged in conformity to the minimum pitch interval of the word lines that is determined in accordance with the layout in the memory array. This provides an advantage that the chip size of the EPROM and further the whole single-chip micon can be reduced.

In the above embodiment, the X-decoder 22 is divided into three components - the predecoder, the main decoder and the buffer having the decoding function, although the invention is not limited to this configuration. For example, the buffer circuit may be constructed either to have no decoding function or to have the main decoder and the buffer while omitting the predecoder.

In the above embodiment, moreover, the main decoder DEC is composed of the precharge MOSFET Qp and the four series connected N-channel type MOSFETs $Q_{d1}$ to $Q_{d4}$, but the number and structure of the MOSFETs need not be limited to those of the embodiment.

The polycrystalline silicon type MOSFET $Q_{25}$ connected with the terminal end of the word line may be replaced by a polycrystalline silicon resistor or an ordinary P-channel type MOSFET.

Since, in the embodiment, the precharge of the data lines is conducted through the column switches $Qc_1$ to $Qc_{16}$, the output of the Y-decoder 23 for decoding the address signals $A_8$ to $A_{11}$ has to be determined before the start of the precharge. For this necessity, the Y-decoder 23 is formed into the static type.

The following effects can be attained according to the present invention:

(1) The sense amplifier is not steadily operated but is started, when the word line in the ROM is selected so that the level of the data line is determined, and is interrupted when its output is latched after the data reading operation. As a result, an effect can be attained such that the power consumption can be reduced by the action to shorten the operation period of the sense amplifier without providing any complicated timing generation circuit such as an address change detection circuit.

(2) The dummy memory array and its sense amplifier are provided in addition to the memory array of the built-in ROM, and the dummy data array is stored in advance with the data which always has its data line level changed when read out, so that the data of the dummy memory array is read out for detection. As a result, an effect can be attained such that, at the instant when the data read out from the dummy memory array is determined, the data read out from the normal memory array is always determined so that the sense amplifier interruption timing for reducing the operation period of the sense amplifier to the minimum required can be accurately detected.

(3) The X-decoder for the EPROM is formed into the dynamic type so that it is dynamically operated in the micon mode by using the timing signal coming from the clock inside of the chip and statically operated in the EPROM mode. As a result, there can be attained an effect that the area occupied by the X-decoder can be reduced together with the chip size by making the number of the elements of the X-decoder smaller than that if the circuit is constructed into the completely static type.

(4) Thanks to the reduction in the number of the elements of the X-decoder, an effect can be attained such that the parasitic capacity is reduced to reduce the power consumption so that fast operation can be realized.

(5) The X-decoder for the EPROM is constructed into the dynamic type so that it is dynamically operated in the micon mode by using the timing signal coming from the clock in the chip and statically operated in the EPROM mode. As a result, an effect can be attained such that the chip size need not be increased, but the existing EPROM writer can be used for the writing operation, because it is unnecessary to feed a suitable timing signal from the outside, and to provide a circuit such as the address change detection circuit inside in the EPROM mode in which the X-decoder is statically operated even if it is of the dynamic type.

Although our invention has been specifically described in connection with the embodiments thereof, it is not limited thereto but can naturally be modified in various ways without departing from the gist thereof. For example, the construction of the sense amplifier need not be limited to those of the foregoing embodiments but can be conceived in various modifications. The present invention can provide the effects if it is applied to the structure in which the through current flows during the operation of the sense amplifier.

In the foregoing embodiments, moreover, the description has been made upon a single-chip micon in which the EPROM is formed on the chip. However, the present invention can naturally be applied to the single-chip micon in which the EPROM is mounted on a package.

In the foregoing embodiments, moreover, the program ROM is constructed of an EPROM in which the FAMOS is used as the memory element, but it may be a programmable memory which is composed of a non-volatile memory element such as MNOS (i.e., Metal Nitride Oxide Semiconductor).

In the foregoing embodiment, the description has been directed mainly to the case in which our invention is applied to a single-chip micon having a built-in EPROM providing the background field of application. The present invention is not limited thereto but can be applied not only to the EPROM or ROM built-in LSI having the clock therein but also to semiconductor memories in general.

What is claimed is:

1. A semiconductor integrated circuit device comprising:
   an information processing circuit which is operated by a periodic timing signal;
   an electrically programmable read only memory which is coupled to said information processing circuit and which is accessed by either said information processing circuit to read out data stored therein or from outside of said semiconductor integrated circuit device to write data therein, wherein said electrically programmable read only memory has a memory array and a peripheral circuit and wherein said peripheral circuit is statically or dynamically operated to access said memory array when said electrically programmable read only memory is accessed by either said information processing circuit or from the outside of said semiconductor integrated circuit device; and
   a control circuit for setting an operation of said peripheral circuit of said electrically programmable read only memory so that said peripheral circuit is statically operated when said electrically programmable read only memory is accessed from the outside of said semiconductor integrated circuit device and said peripheral circuit is dynamically operated in response to said periodic timing signal when said electrically programmable read only memory is accessed by said information processing circuit.

2. A semiconductor integrated circuit device according to claim 1,
   wherein said memory array includes a plurality of erasably programmable semiconductor nonvolatile memory elements.

3. A semiconductor integrated circuit device according to claim 1,
   wherein said peripheral circuit includes a read circuit having: a sense amplifier made receptive to a data signal from said memory array; and a latch circuit made receptive to the output of said sense amplifier, and
   wherein said control circuit is operative to output a control signal for interrupting the operation current of said sense amplifier after read data has been latched by said latch circuit.

4. A semiconductor integrated circuit device according to claim 1, wherein said electrically programmable read only memory is accessed from the outside of said semiconductor integrated circuit device by a write unit externally coupled to said electrically programmable read only memory, and wherein said write unit provides the data to be written into said electrically programmable read only memory.

5. A semiconductor integrated circuit device according to claim 1,
   wherein said peripheral circuit includes an address decoder which is dynamically operated by said periodic timing signal.

6. A semiconductor integrated circuit device according to claim 4, wherein said write unit provides supply voltages to said electrically programmable read only memory.

7. A single-chip microcomputer comprising:
   a bus;
   a central processing unit (CPU) which is operated by a periodic timing signal and which is coupled to said bus;
   an electrically programmable read only memory which has address input terminals and data input/output terminals coupled to said bus and which is accessed by either said CPU or from outside of said single-chip microcomputer, wherein said electrically programmable read only memory has a memory array and a peripheral circuit to access said memory array;
   a first external terminal which is coupled to said bus and to which an address signal to be fed to said electrically programmable read only memory is fed when said electrically programmable read only memory is accessed from the outside of said single-chip microcomputer;
   a second external terminal which is coupled to said bus and to which data to be fed to said electrically programmable read only memory is fed when said electrically programmable read only memory is accessed from the outside of said single-chip microcomputer;
   a third external terminal to which an indication signal for indicating whether said electrically programmable read only memory is accessed by said CPU or from the outside of said single-chip microcomputer is fed;

discriminator means responsive to said indication signal and for discriminating whether or not said indication signal is indicating that said electrically programmable read only memory is accessed from the outside of said single-chip microcomputer; and
control means coupled to said peripheral circuit of electrically programmable read only memory and responsive to an output signal of said discriminator means and for setting an operation of said peripheral circuit of said electrically programmable read only memory so that said peripheral circuit is statically operated when said electrically programmable read only memory is accessed from the outside of said single-chip microcomputer and said peripheral circuit of said electrically programmable read only memory is dynamically operated in response to said periodic timing signal when said electrically programmable read only memory is accessed by said CPU.

8. A single-chip microcomputer according to claim 7, wherein said memory array includes a plurality of erasably programmable semiconductor nonvolatile memory elements.

9. A single-chip microcomputer according to claim 7, wherein said bus includes a data bus for transmitting data and an address bus for transmitting an address signal.

10. A single-chip microcomputer according to claim 7, wherein said CPU comprises clock generator means for providing said periodic timing signal to said electrically programmable read only memory so that said electrically programmable read only memory is synchronously operated with said CPU when said electrically programmable read only memory is accessed by said CPU, and wherein said clock generator means does not provide said periodic timing signal to said electrically programmable read only memory when said electrically programmable read only memory is accessed from the outside of said single-chip microprocessor.

11. A single-chip microcomputer according to claim 7, wherein said electrically programmable read only memory is accessed from the outside of said semiconductor integrated circuit device by a write unit to be externally coupled, and wherein said write unit provides the data to be written into said electrically programmable read only memory.

12. A single-chip microcomputer according to claim 11, wherein said write unit provides supply voltages to said electrically programmable read only memory.

13. A single-chip microcomputer according to claim 7, wherein said peripheral circuit comprises an address decoder including a first MOSFET connected between one of the terminals of a power supply and an output node for feeding said output node with either a charge for the dynamic operation or an operation current for the static operation; and a plurality of second MOSFETs connected in series between said output node and the other terminal of said power supply for being switched by respective address signals.

14. A single-chip microcomputer comprising:
a bus;
a central processing unit (CPU) which is operated by a periodic timing signal and which is coupled to said bus;
an electrically programmable read only memory which has address input terminals and data input/output terminals coupled to said bus and which is accessed by either said CPU or from outside of said single-chip microcomputer, wherein said electrically programmable read only memory has a memory array and a peripheral circuit to access said memory array;
a first external terminal which is coupled to said bus and to which an address signal to be fed to said electrically programmable read only memory is fed when said electrically programmable read only memory is accessed from the outside of said single-chip microcomputer;
a second external terminal which is coupled to said bus and to which data to be fed to said electrically programmable read only memory is fed when said electrically programmable read only memory is accessed from the outside of said single-chip microcomputer;
discriminator means for discriminating whether or not said electrically programmable read only memory is accessed from the outside of said single-chip microcomputer; and
control means coupled to said peripheral circuit of electrically programmable read only memory and responsive to an output signal of said discriminator means for setting an operation of said peripheral circuit of said electrically programmable read only memory so that said peripheral circuit is statically operated when said electrically programmable read only memory is accessed from the outside of said single-chip microcomputer and said peripheral circuit of said electrically programmable read only memory is dynamically operated in response to said periodic timing signal when said electrically programmable read only memory is accessed by said CPU.

15. A single-chip microcomputer according to claim 14, wherein said CPU comprises clock generator means for providing said periodic timing signal to said electrically programmable read only memory so that said electrically programmable read only memory is synchronously operated with said CPU when said electrically programmable read only memory is accessed by said CPU, and wherein said clock generator means does not provide said periodic timing signal to said electrically programmable read only memory when said electrically programmable read only memory is accessed from the outside of said single-chip microprocessor.

16. A single-chip microcomputer according to claim 14, wherein said electrically programmable read only memory is accessed from the outside of said semiconductor integrated circuit device by a write unit to be externally coupled, and wherein said write unit provides the data to be written into said electrically programmable read only memory.

17. A single-chip microcomputer according to claim 16, wherein said write unit provides supply voltages to said electrically programmable read only memory.

18. A single-chip microcomputer according to claim 14, wherein said peripheral circuit comprises an address decoder including a first MOSFET connected between one of the terminals of a power supply and an output node for feeding said output node with either a charge for the dynamic operation or an operation current for the static operation; and a plurality of second MODFETs connected in series between said output node and the other terminal of said power supply for being switched by respective address signals.

19. A single-chip microcomputer according to claim 14 wherein said memory array includes a plurality of erasably programmable semiconductor nonvolatile memory elements.

20. A single-chip microcomputer according to claim 14, wherein said bus includes a data bus for transmitting data and an address but for transmitting an address signal.

21. A single-chip microcomputer comprising:
a bus;
a central processing unit (CPU) which is operated by a periodic timing signal and which is coupled to said bus;
an electrically programmable read only memory which has address input terminals and data input-/output terminals coupled to said bus and which is accessed by either said CPU or from outside of said single-chip microcomputer, wherein said electrically programmable read only memory has a memory array and a peripheral circuit to access said memory array;
a first external terminal which is coupled to said bus and for transmitting an address signal from the outside of said single-chip microprocessor to said bus when said electrically programmable read only memory is accessed from the outside of said single-chip microcomputer;
a second external terminal which is coupled to said bus and to which data to be fed to said electrically programmable read only memory is fed when said electrically programmable read only memory is accessed by the outside of said single-chip microcomputer; and
control means coupled to said peripheral circuit of said electrically programmable read only memory and for setting an operation of said peripheral circuit of said electrically programmable read only memory so that said peripheral circuit is statically operated when said electrically programmable read only memory is accessed from the outside of said single-chip microcomputer and said peripheral circuit of said electrically programmable read only memory is dynamically operated in response to said periodic timing signal when said electrically programmable read only memory is accessed by said CPU.

22. A single-chip microcomputer according to claim 21, wherein said CPU comprises clock generator means for providing said periodic timing signal to said electrically programmable read only memory so that said electrically programmable read only memory is synchronously operated with said CPU when said electrically programmable read only memory is accessed by said CPU, and wherein said clock generator means does not provide said periodic timing signal to said electrically programmable read only memory when said electrically programmable read only memory is accessed from the outside of said single-chip microprocessor.

23. A single-chip microcomputer according to claim 21, wherein said electrically programmable read only memory is accessed from the outside of said semiconductor integrated circuit device by a write unit to be externally coupled to said electrically programmable read only memory, and wherein said write unit provides the data to be written into said electrically programmable read only memory.

24. A single-chip microcomputer according to claim 23, wherein said write unit provides supply voltages to said electrically programmable read only memory.

25. A single-chip microcomputer according to claim 21, wherein said peripheral circuit comprises an address decoder including a first MOSFET connected between one of the terminals of a power supply and an output node for feeding said output node with either a charge for the dynamic operation or an operation current for the static operation; and a plurality of second MOSFETs connected in series between said output node and the other terminal of said power supply for being switched by respective address signals.

26. A single-chip microcomputer according to claim 21, wherein said memory array includes a plurality of erasably programmable semiconductor nonvolatile memory elements.

27. A single-chip microcomputer according to claim 21, wherein said bus includes a data bus for transmitting data and an address bus for transmitting an address signal.

28. A one-chip microcomputer including an electrically programmable read only memory and a microprocessor which is coupled to said electrically programmable read only memory via a bus and which executes a predetermined data processing operation in accordance with a program stored in said electrically programmable read only memory in response to a periodic timing signal, wherein said electrically programmable read only memory includes a memory array and a peripheral circuit for accessing said memory array, said one-chip microcomputer comprising:
a first external terminal which is coupled to said bus and to which an address signal to be fed to said electrically read only memory is fed when said electrically read only memory is accessed from the outside of said one-chip microcomputer;
a second external terminal which is coupled to said bus and to which data constituting said program to be written into said electrically programmable read only memory is fed when said electrically programmable read only memory is accessed from the outside of said one-chip microcomputer;
discriminator means for discriminating whether or not said electrically programmable read only memory is accessed from the outside of said one-chip microcomputer; and
control means coupled to said peripheral circuit and responsive to an output of said discriminator means and for controlling an operation of said peripheral circuit so that said peripheral circuit is statically operated when said electrically programmable read only memory is accessed from the outside of said one-chip microcomputer and said peripheral circuit of said electrically programmable read only memory is dynamically operated in response to said periodic timing signal when said electrically programmable read only memory is accessed by said microcomputer.

29. A one-chip microcomputer according to claim 28, wherein said peripheral circuit comprises an address decoder including a first MOSFET connected between one of the terminals of a power supply and an output node for feeding said output node with either a charge for the dynamic operation or an operation current for the static operation; and a plurality of second MOSFETs connected in series between said output node and the other terminal of said power supply for being switched by respective address signals.

30. A one-chip microcomputer according to claim 29, wherein said memory array includes a plurality of erasably programmable semiconductor nonvolatile memory elements.

31. A one-chip microcomputer including an electrically programmable read only memory in which data constituting a program is written by writer means provided on the outside of said one-chip microcomputer and a microprocessor which is coupled to said electrically programmable read only memory via a bus and which executes a predetermined data processing operation in accordance with the program stored in said electrically programmable read only memory in response to a periodic timing signal, wherein said electrically programmable read only memory includes a memory array and a peripheral circuit for accessing said memory array, said one-chip microcomputer comprising:
- a first external terminal which is coupled to said bus and to which an address signal to be fed to said electrically read only memory is fed when said electrically read only memory is accessed from the outside of said one-chip microcomputer;
- a second external terminal which is coupled to said bus and to which data constituting said program to be written into said electrically programmable read only memory is fed when said electrically programmable read only memory is accessed from the outside of said one-chip microcomputer;
- discriminator means for discriminating whether or not said electrically programmable read only memory is accessed from the outside of said one-chip microcomputer; and
- control means coupled to said peripheral circuit and responsive to an output of said discriminator means and for controlling an operation of said peripheral circuit so that said peripheral circuit is statically operated when said electrically programmable read only memory is accessed from the outside of said one-chip microcomputer and said peripheral circuit of said electrically programmable read only memory is dynamically operated in response to said periodic timing signal when said electrically programmable read only memory is accessed by said microcomputer.

32. A one-chip microcomputer according to claim 31, wherein said peripheral circuit comprises an address decoder including a first MOSFET connected between one of the terminals of a power supply and an output node for feeding said output node with either a charge for the dynamic operation or an operation current for the static operation; and a plurality of second MOSFETs connected in series between said output node and the other terminal of said power supply for being switched by respective address signals.

33. A one-chip microcomputer according to claim 31, wherein said memory array includes a plurality of erasably programmable semiconductor nonvolatile memory elements.

34. A single-chip microcomputer including an electrically programmable read only memory in which data constituting a program is written by writer means provided on the outside of said single-chip microcomputer and a microprocessor which is coupled to said electrically programmable read only memory via a bus and which executes a predetermined data processing operation in accordance with the program stored in said electrically programmable read only memory in response to a periodic timing signal, wherein said electrically programmable read only memory includes a memory array and a peripheral circuit to access said memory array, and wherein said writer means provides a supply voltage to said electrically programmable read only memory, said single-chip microcomputer comprising:
- a first external terminal coupled to said bus for transmitting an address signal from the writer means to said bus when said electrically read only memory is accessed by the writer means;
- a second external terminal which is coupled to said bus and to which the data to be fed to said electrically programmable read only memory from the writer means is fed;
- a third external terminal to which an indication signal for indicating whether said electrically programmable read only memory is accessed by said microprocessor or by the writer means is fed;
- discriminator means responsive to said indication signal for discriminating whether or not said indication signal is indicating that said electrically programmable read only memory is accessed by the writer means; and
- control means coupled to said peripheral circuit of the electrically programmable read only memory and responsive to an output signal of said discriminator means for setting an operation of said peripheral circuit of said electrically programmable read only memory so that said peripheral circuit is statically operated when said electrically programmable read only memory is accessed by the writer means and said peripheral circuit of said electrically programmable read only memory is dynamically operated in response to said periodic timing signal when said electrically programmable read only memory is accessed by said microprocessor.

35. A single-chip microcomputer including an electrically programmable read only memory in which data constituting a program is written by writer means provided on the outside of said single-chip microcomputer and a microprocessor which is coupled to said electrically programmable read only memory via a bus and which executes a predetermined data processing operation in accordance with the program stored in said electrically programmable read only memory in response to a periodic timing signal, wherein said electrically programmable read only memory includes a memory array and a peripheral circuit to access said memory array, and wherein said writer means provides a supply voltage to said electrically programmable read only memory, said single-chip microcomputer comprising:
- a first external terminal coupled to said bus and for transmitting and address signal from the writer means to said bus when said electrically programmable read only memory is accessed by the writer means;
- a second external terminal which is coupled to said bus and to which the data to be fed to said electrically programmable read only memory from the writer means is fed;
- discriminator means for discriminating whether or not said electrically programmable read only memory is accessed by the writer means; and
- control means coupled to said peripheral circuit of the electrically programmable read only memory and responsive to an output signal of said discriminator means for setting an operation of said peripheral circuit of said electrically programmable read only memory so that said peripheral circuit is statically operated when said electrically programmable read only memory is accessed by the writer means and said peripheral circuit of said electrically programmable read only memory is dynamically operated in response to said periodic timing signal when said electrically programmable read only memory is accessed by said microprocessor.

36. A single-chip microcomputer including an electrically programmable read only memory in which data constituting a program is written by writer means provided on the outside of said single-chip microcomputer and a microprocessor which is coupled to said electrically programmable read only memory via a bus and which executes a predetermined data processing operation in accordance with the program stored in said electrically programmable read only memory in response to a periodic timing signal, wherein said electrically programmable read only memory includes a memory array and a peripheral circuit to access said memory array, and wherein said writer means provides a supply voltage to said electrically programmable read only memory, said single-chip microcomputer comprising:

a first external terminal coupled to said bus and for transmitting an address signal from the writer means to said bus when said electrically programmable read only memory is accessed by the writer means;

a second external terminal which is coupled to said bus and to which the data to be fed to said electrically programmable read only memory from the writer means is fed; and control means coupled to said peripheral circuit of said electrically programmable read only memory for setting an operation of said peripheral circuit of said electrically programmable read only memory so that said peripheral circuit is statically operated when said electrically programmable read only memory is accessed by the writer means and said peripheral circuit of said electrically programmable read only memory is dynamically operated in response to said periodic timing signal when said electrically programmable read only memory is accessed by said microprocessor.

* * * * *